United States Patent
Jung et al.

(10) Patent No.: US 12,272,628 B2
(45) Date of Patent: Apr. 8, 2025

(54) SEMICONDUCTOR PACKAGE HAVING INTERPOSER SUBSTRATE

(71) Applicant: Samsung Electronics Co., Ltd., Suwon-si (KR)

(72) Inventors: Yanggyoo Jung, Gwangmyeong-si (KR); Seungbin Baek, Suwon-si (KR); Hyunjung Song, Hwaseong-si (KR); Sangmin Yong, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 397 days.

(21) Appl. No.: 17/673,865

(22) Filed: Feb. 17, 2022

(65) Prior Publication Data
US 2022/0415772 A1    Dec. 29, 2022

(30) Foreign Application Priority Data
Jun. 29, 2021    (KR) ................ 10-2021-0084743

(51) Int. Cl.
*H01L 23/498*    (2006.01)
*H01L 23/00*    (2006.01)
*H01L 23/538*    (2006.01)
*H01L 25/18*    (2023.01)

(52) U.S. Cl.
CPC .... *H01L 23/49816* (2013.01); *H01L 23/5385* (2013.01); *H01L 24/16* (2013.01); *H01L 25/18* (2013.01); *H01L 2224/16225* (2013.01)

(58) Field of Classification Search
None
See application file for complete search history.

(56) References Cited

U.S. PATENT DOCUMENTS

| | | | |
|---|---|---|---|
| 7,335,995 B2 | 2/2008 | Pflughaupt et al. | |
| 7,462,940 B2 | 12/2008 | Bauer et al. | |
| 9,402,315 B2 | 7/2016 | Chun et al. | |
| 9,601,466 B2 | 3/2017 | Yoon et al. | |
| 9,698,088 B2 | 7/2017 | Kwon et al. | |
| 2008/0283994 A1* | 11/2008 | Tsai ............. | H01L 25/105 |
| | | | 257/E23.024 |
| 2012/0319289 A1 | 12/2012 | Mori et al. | |
| 2013/0264708 A1 | 10/2013 | Hiwatashi | |

(Continued)

FOREIGN PATENT DOCUMENTS

KR    1020110017153 A    2/2011

*Primary Examiner* — Hung K Vu
(74) *Attorney, Agent, or Firm* — Muir Patent Law, PLLC

(57) ABSTRACT

Provided is a semiconductor package including a first wiring pad on a package substrate; a first wiring connection part on the first wiring pad and including a wiring solder layer; a second wiring pad on the package substrate; a second wiring connection part on the second wiring pad and including a conductor; an interposer substrate on the first wiring connection part and the second wiring connection part, wherein a first substrate connection part and a second substrate connection part respectively electrically connected to the first wiring connection part and the second wiring connection part are arranged on a rear surface of the interposer substrate; and semiconductor chips apart from each other in a two-dimensional manner on the interposer substrate, wherein each of the semiconductor chips is electrically connected to the interposer substrate via a chip connection pillar.

20 Claims, 17 Drawing Sheets

(56) References Cited

U.S. PATENT DOCUMENTS

| | | | |
|---|---|---|---|
| 2019/0051642 A1* | 2/2019 | Gupta Hyde | G06F 1/3296 |
| 2021/0320067 A1* | 10/2021 | Kim | H01L 23/49838 |
| 2022/0013492 A1* | 1/2022 | Huang | H01L 24/14 |

* cited by examiner

SEMICONDUCTOR PACKAGE HAVING INTERPOSER SUBSTRATE

CROSS-REFERENCE TO RELATED APPLICATION

This application is based on and claims priority under 35 U.S.C. § 119 to Korean Patent Application No. 10-2021-0084743, filed on Jun. 29, 2021, in the Korean Intellectual Property Office, the disclosure of which is incorporated by reference herein in its entirety.

BACKGROUND

The inventive concept relates to semiconductor packages, and more particularly, to a semiconductor package including an interposer substrate.

With the development of the electronic industry, the demand for high functionalization and miniaturization of electronic components is rapidly increasing. In order to respond to this trend, a semiconductor package in which an interposer substrate is mounted on a package substrate and then a plurality of semiconductor chips are spaced apart from one another in a horizontal direction and stacked on the interposer substrate has been proposed.

SUMMARY

The inventive concept provides a semiconductor package with improved interconnection reliability between an interposer substrate and a package substrate.

According to an aspect of the inventive concept, there is provided a semiconductor package including a first wiring pad formed on a package substrate; a first wiring connection part formed on the first wiring pad and including a wiring solder layer; a second wiring pad formed apart from the first wiring pad on the package substrate; a second wiring connection part formed on the second wiring pad and including a conductor; an interposer substrate mounted on the first wiring connection part and the second wiring connection part, wherein a first substrate connection part and a second substrate connection part respectively electrically connected to the first wiring connection part and the second wiring connection part are arranged on a rear surface of the interposer substrate; and a plurality of semiconductor chips mounted apart from each other in a two-dimensional (2D) manner on the interposer substrate, wherein each of the semiconductor chips is electrically connected to the interposer substrate via a chip connection pillar.

According to another aspect of the inventive concept, there is provided a semiconductor package including a package substrate having an interposer mounted area; an interposer substrate mounted on the interposer mounted area on the package substrate and including a first chip mounted area and a second chip mounted area spaced apart from each other in a 2D manner; a first semiconductor chip mounted on the first chip mounted area on the interposer substrate and electrically connected to the interposer substrate via the first chip connection pillar; and a second semiconductor chip mounted on the second chip mounted area on the interposer substrate and electrically connected to the interposer substrate via the second chip connection pillar.

The semiconductor package further includes a first wiring pad formed in a first area of the package substrate corresponding to the first chip mounted area; a first wiring connection part formed on the first wiring pad and including a wiring solder layer; a second wiring pad formed in a second area of the package substrate corresponding to the second chip mounted area; a second wiring connection part formed on the second wiring pad and including a conductor; a first substrate connection part formed on a rear surface of the interposer substrate in the first chip mounted area and electrically connected to the first wiring connection part; and a second substrate connection part formed on a rear surface of the interposer substrate in the second chip mounted area and electrically connected to the second wiring connection part.

According to another aspect of the inventive concept, there is provided a semiconductor package including a package substrate having an interposer mounted area; an interposer substrate mounted on the interposer mounted area on the package substrate and including a first chip mounted area, a second chip mounted area, and a third chip mounted area spaced apart from each other in a 2D manner; a first semiconductor chip mounted on the first chip mounted area on the interposer substrate and electrically connected to the interposer substrate via a first chip connection pillar; a second semiconductor chip mounted on the second chip mounted area on the interposer substrate and electrically connected to the interposer substrate via a second chip connection pillar; and a third semiconductor chip mounted on the third chip mounted area on the interposer substrate and electrically connected to the interposer substrate via a third chip connection pillar.

The semiconductor package further includes a first wiring pad formed in a first area of the package substrate corresponding to the first chip mounted area; a first wiring connection part formed on the first wiring pad and including a wiring solder layer; a second wiring pad and a third wiring pad formed in a second area and a third area of the package substrate respectively corresponding to the second chip mounted area and the third chip mounted area; a second wiring connection part and a third wiring connection part respective formed on the second wiring pad and the third wiring pad and each including a conductor; a first substrate connection part formed on one surface of the interposer substrate in the first chip mounted area and electrically connected to the first wiring connection part; and a second substrate connection part and a third substrate connection part formed on rear surfaces of the interposer substrate in the second and second chip mounted areas, respectively, and electrically connected to the second wiring connection part and the third wiring connection part.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

The inventive concept will now be described more fully with reference to the accompanying drawings, in which exemplary embodiments of the inventive concept are shown. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration. One embodiment may be implemented, or a plurality of embodiments may be combined and implemented. However, the inventive concept is not limited to these embodiments.

As used herein, the singular forms "a", "an" and "the" of components are intended to include the plural forms as well, unless the context clearly indicates otherwise. In the present specification, the drawings are exaggerated in order to more clearly explain the inventive concept. Like numbers refer to like elements throughout.

Figure 1:
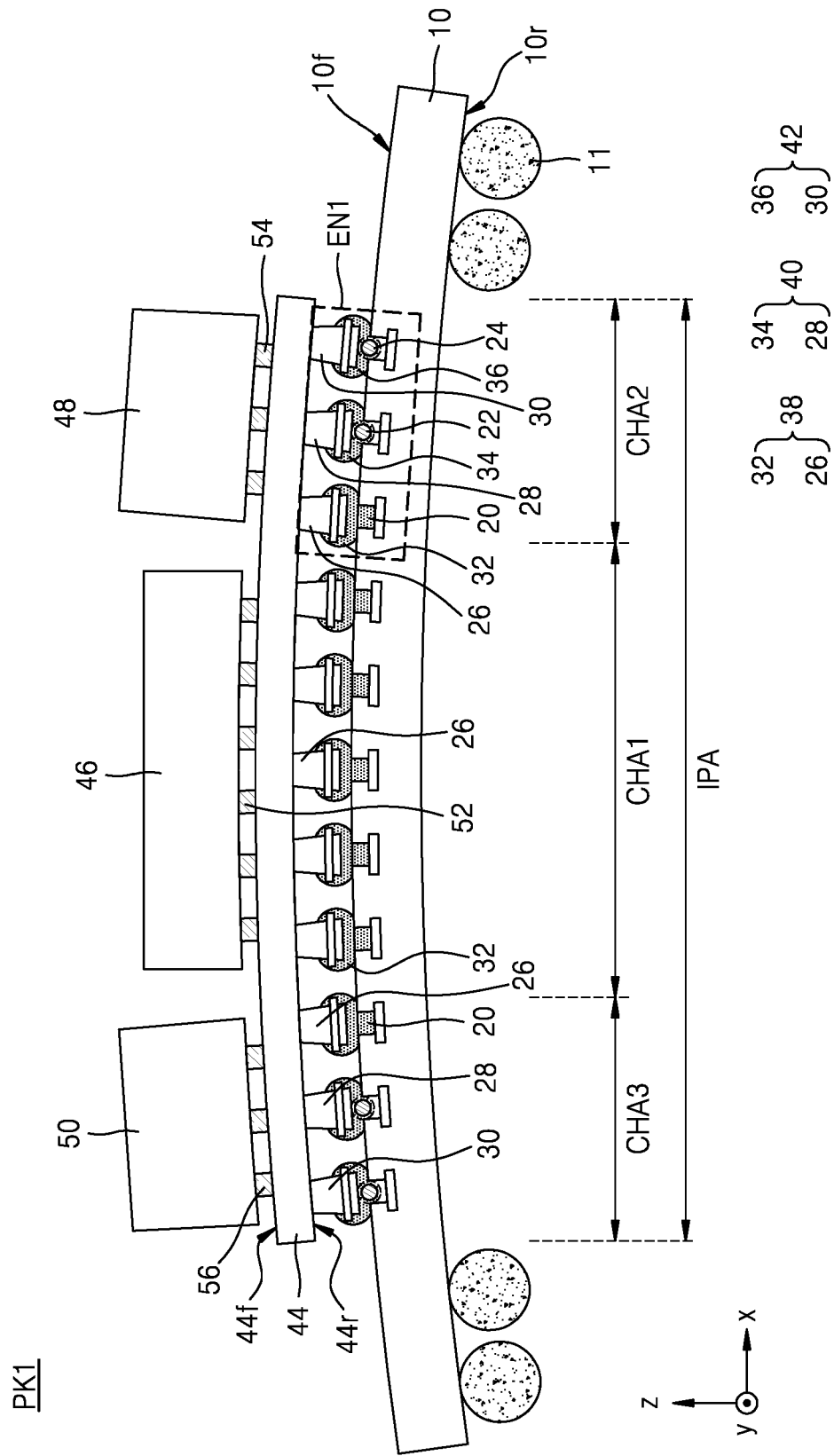
FIG. 1 is a cross-sectional view of a semiconductor package, according to an example embodiment of the inventive concept.
Figure 2:
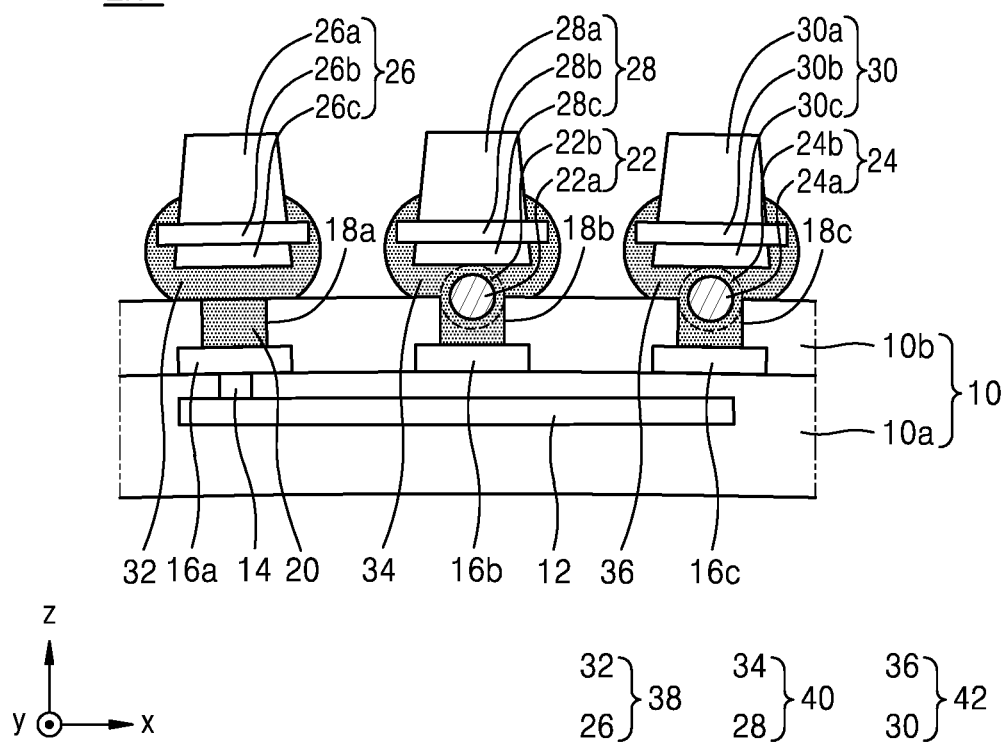
FIG. 2 is a magnified view of a portion EN1 of FIG. 1.
Figure 3:
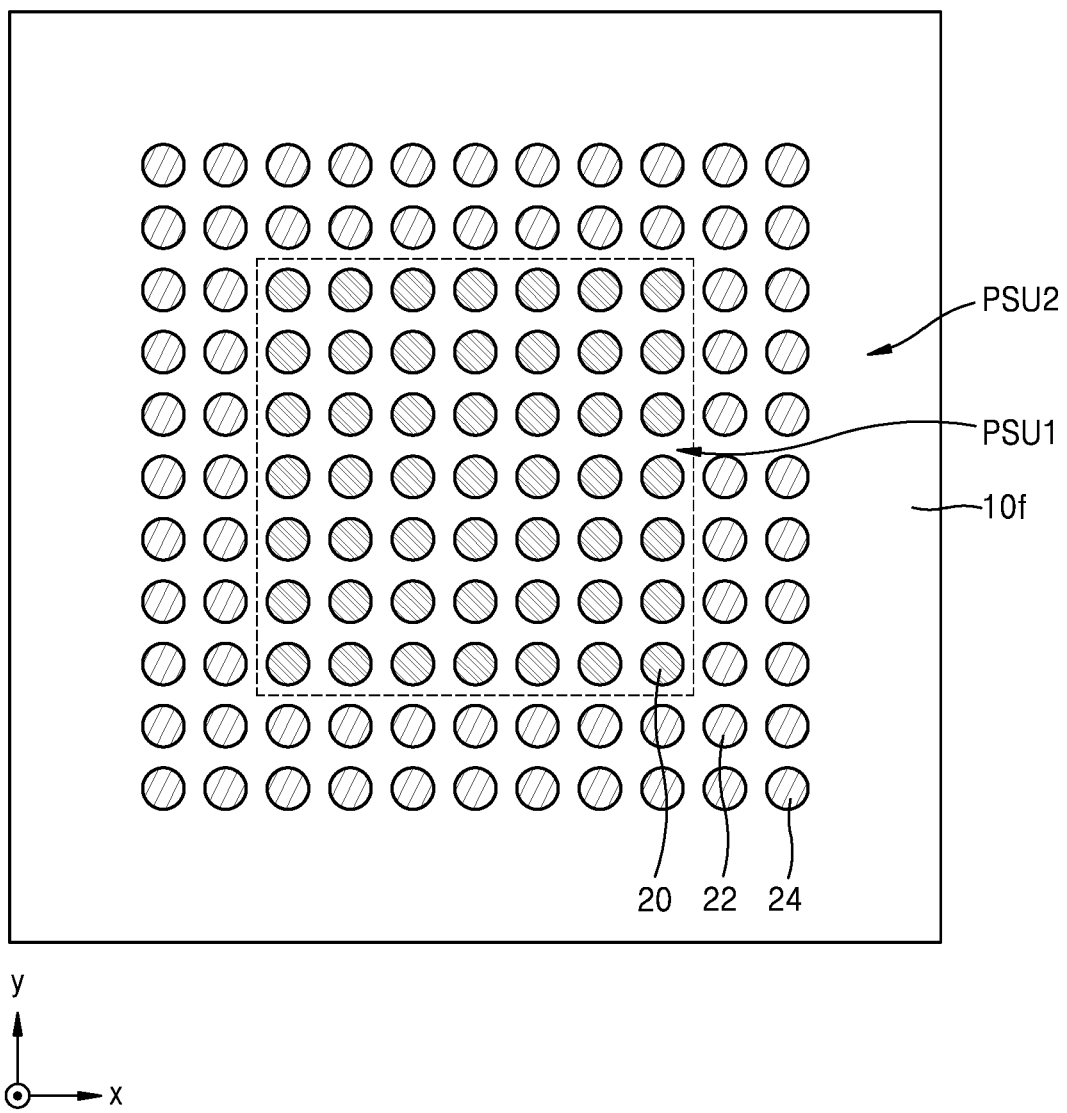
FIG. 3 is a plan view of a package substrate of FIG. 1.

FIG. 1 is a cross-sectional view of a semiconductor package PK1 according to an example embodiment of the inventive concept, FIG. 2 is a magnified view of a portion EN1 of FIG. 1, and FIG. 3 is a plan view of a package substrate 10 of FIG. 1.

In detail, the semiconductor package PK1 may include the package substrate 10. The package substrate 10 may include a core layer 10a and a protective layer 10b. The core layer 10a may include phenol resin, epoxy resin, polyimide, or a combination thereof. For example, the package substrate 10 may include flame retardant 4 (FR4), tetrafunctional epoxy, polyphenylene ether, epoxy/polyphenylene oxide, bismaleimide triazine (BT), thermount, cyanate ester, polyimide, or liquid crystal polymer. The protective layer 10b may be a solder resist layer.

The package substrate 10 may have an interposer mounted area IPA. Warpage may occur in the package substrate 10 during a package manufacturing process. The package substrate 10 may have warpage in the shape of a cry face in which a center area is convex above a perimeter area (also referred to herein as cry face warpage).

The package substrate 10 may be a printed circuit board (PCB) substrate. The package substrate 10 may include a surface 10f and a rear surface 10r. External connection terminals 11 may be arranged on the rear surface 10r of the package substrate 10. For convenience of explanation, FIG. 1 illustrates the external connection terminals 11 arranged only on a perimeter area of the rear surface 10r. However, the external connection terminals 11 may be arranged on the entire rear surface 10r. When the package substrate 10 is a main package substrate, the external connection terminals 11 may not be formed.

Wiring layers 12 and 14 may be formed within the package substrate 10. A first wiring pad 16a, a second wiring pad 16b, and a third wiring pad 16c spaced apart from each other in a two-dimensional (2D) manner may be included within the package substrate 10. The first wiring pad 16a, the second wiring pad 16b, and the third wiring pad 16c may be spaced apart from each other in a first direction (X direction).

The first wiring pad 16a, the second wiring pad 16b, and the third wiring pad 16c may be portions of the wiring layers 12 and 14. The wiring layers 12 and 14, the first wiring pad 16a, the second wiring pad 16b, and the third wiring pad 16c may be formed of copper (Cu), nickel (Ni), aluminum (Al), silver (Ag), gold (Au), or a combination thereof. For convenience of explanation, FIG. 2 illustrates that the wiring layers 12 and 14 and the first wiring pad 16a are electrically connected to one another. However, the wiring layers 12 and 14 may be electrically connected to the second wiring pad 16b and the third wiring pad 16c.

The first wiring pad 16a may be arranged on a center area of the package substrate 10. A first wiring connection part 20 is formed on the first wiring pad 16a. The first wiring connection part 20 may be formed within a first recess hole 18a recessed from the surface 10f of the package substrate 10.

According to the present embodiment, a depth of the first recess hole 18a may be 10 micrometers (um) to 30 um in consideration of diameters of conductors 22a and 24a, which will be described later. According to the present embodiment, a diameter of the first recess hole 18a may be 20 um to 50 um in consideration of the diameters of conductors 22a and 24a, which will be described later.

The first wiring connection part 20 may be formed using a wiring solder layer. The wiring solder layer may be formed of tin, a tin-copper alloy, or a tin-silver alloy. The first wiring pad 16a and the first wiring connection part 20 may constitute a first pad structure (16a, 20).

As shown in FIG. 3, the first wiring connection part 20 may be arranged on a center area PSU1 of the surface 10f of the package substrate 10. A plurality of first wiring connection parts 20 may be arranged apart from one another on the center area PSU1 of the surface 10f of the package substrate 10.

The second wiring pad 16b may be arranged on a perimeter area of the package substrate 10. A second wiring connection part 22 is formed on the second wiring pad 16b. The second wiring connection part 22 may be formed within a second recess hole 18b recessed from the surface 10f of the package substrate 10. A depth and a diameter of the second recess hole 18b are the same as those of the first recess hole 18a.

The second wiring connection part 22 may include a conductor 22a. The conductor 22a may be a conductive core ball, for example, a metal core ball. According to the present embodiment, the conductive core ball constituting the conductor 22a may have a diameter of 10 um to 30 um. The metal core ball may be a copper ball. The second wiring connection part 22, namely, the conductor 22a, may be a stopper layer that prevents stress from an interposer substrate 44 where warpage has occurred.

The second wiring connection part 22 may include the conductor 22a, and a cover solder layer 22b buried in the second recess hole 18b while surrounding the conductor 22a. The cover solder layer 22b may be formed of tin, a tin-copper alloy, or a tin-silver alloy. The second wiring pad 16b and the second wiring connection part 22 may constitute a second pad structure (16b, 22).

As shown in FIG. 3, the second wiring connection part 22 may be arranged on a perimeter area PSU2 of the surface 10f of the package substrate 10. A plurality of second wiring connection parts 22 may be arranged around the center area PSU1 of the surface 10f of the package substrate 10. For example, the plurality of second of second wiring connection parts 22 may surround the center area PSU1 of the surface 10f of the package substrate 10. The plurality of second wiring connection parts 22 may be spaced apart from one another.

The third wiring pad 16c may be arranged on the perimeter area of the package substrate 10. A third wiring connection part 24 is formed on the third wiring pad 16c. The third wiring connection part 24 may be formed within a third recess hole 18c recessed from the surface 10f of the package substrate 10. A depth and a diameter of the third recess hole 18b are the same as those of the first recess hole 18a.

The third wiring connection part 24 may include a conductor 24a. The conductor 24a may be a conductive core ball, for example, a metal core ball. According to the present embodiment, the conductive core ball constituting the conductor 24a may have a diameter of 10 um to 30 um. The metal core ball may be a copper ball.

The third wiring connection part 24 may include the conductor 24a, and a cover solder layer 24b buried in the third recess hole 18c while surrounding the conductor 24a. The cover solder layer 24b may be formed of tin, a tin-copper alloy, or a tin-silver alloy. The third wiring pad 16c and the third wiring connection part 24 may constitute a third pad structure (16c, 24).

As shown in FIG. 3, the third wiring connection part 24 may be arranged on the perimeter area PSU2 of the surface 10f of the package substrate 10. The third wiring connection part 24 may be arranged around the second wiring connection part 22. For example, a plurality of third wiring connection part 24 may surround the plurality of second wiring connection parts 22. The plurality of second wiring connection parts 24 may be arranged apart from one another.

The first wiring connection part 20 may have a different configuration from the second wiring connection part 22 and the third wiring connection part 24. The second wiring connection part 22 and the third wiring connection part 24 may have the same configurations. The first pad structure (16a, 20) may have a different configuration from the second pad structure (16b, 22) and the third pad structure (16c, 24). The second pad structure (16b, 22) and the third pad structure (16c, 24) may have the same configurations.

FIGS. 1 and 2 illustrate the second pad structure (16b, 22) and the third pad structure (16c, 24) as different structures from the first pad structure (16a, 20). However, in some cases, only one of the second pad structure (16b, 22) and the third pad structure (16c, 24) may be included.

The interposer substrate 44 may be mounted on the first wiring connection parts 20, the second wiring connection parts 22, and the third wiring connection parts 24. The interposer substrate 44 may be formed of silicon, glass, ceramic, or resin. According to the present embodiment, the interposer substrate 44 may be formed of silicon.

The interposer substrate 44 may have a surface 44f and a rear surface 44r. A first substrate connection part 38 electrically connected to the first wiring connection part 20 may be formed on the rear surface 44r of the interposer substrate 44. The first substrate connection part 38 may include a first substrate pillar 26 formed on the rear surface 44r of the interposer substrate 44, and a first substrate solder layer 32 formed on the first substrate pillar 26. The first substrate pillar 26 may be referred to as a first substrate bump. The first substrate solder layer 32 is soldered with the wiring solder layer constituting the first wiring connection part 20.

The first substrate pillar 26 may include a plurality of metal layers 26a, 26b, and 26c. The plurality of metal layers 26a, 26b, and 26c may be selected from nickel (Ni), aluminum (Al), iron (Fe), copper (Cu), titanium (Ti), chromium (Cr), gold (Au), silver (Ag), palladium (Pd), and platinum (Pt). The first substrate pillar 26 may include a lower metal layer 26a, an intermediate metal layer 26b, and an upper metal layer 26c. According to the present embodiment, the lower metal layer 26a may be a copper layer, the intermediate metal layer 26b may be a nickel layer, and the upper metal layer 26c may be a copper layer, a palladium layer, or a gold layer.

The intermediate metal layer 26b may be a diffusion prevention layer that prevents diffusion of copper. A width of the intermediate metal layer 26b in the horizontal direction (the X direction and/or the Y direction) may be greater than widths of each of the lower metal layer 26a and the upper metal layer 26c in the horizontal direction (the X direction and/or the Y direction). The first substrate solder layer 32 may be formed of tin, a tin-copper alloy, or a tin-silver alloy. The first substrate solder layer 32 may surround a portion of the first substrate pillar 26 while surrounding the first wiring connection part 20. For example, the first substrate solder layer 32 may contact side surfaces of the lower metal layer 26a, contact top, side, and bottom surfaces of the intermediate metal layer 26b, contact side and bottom surfaces of the upper metal layer 26c, and contact a top surface of the first wiring connection part 20.

A second substrate connection part 40 electrically connected to the second wiring connection part 22 may be formed on the rear surface 44r of the interposer substrate 44. The second substrate connection part 40 may include a second substrate pillar 28 formed on the rear surface 44r of the interposer substrate 44, and a second substrate solder layer 34 formed on the second substrate pillar 28. The second substrate pillar 28 may be referred to as a second substrate bump. The second substrate solder layer 34 is soldered with the cover solder layer 22b constituting the second wiring connection part 22.

The second substrate pillar 28 may include a plurality of metal layers 28a, 28b, and 28c. The second substrate pillar 28 may be formed of the same material as the first substrate pillar 26. The plurality of metal layers 28a, 28b, and 28c may be selected from nickel (Ni), aluminum (Al), iron (Fe), copper (Cu), titanium (Ti), chromium (Cr), gold (Au), silver (Ag), palladium (Pd), and platinum (Pt).

The second substrate pillar 28 may include a lower metal layer 28a, an intermediate metal layer 28b, and an upper metal layer 28c. According to the present embodiment, the lower metal layer 28a may be a copper layer, the intermediate metal layer 28b may be a nickel layer, and the upper metal layer 28c may be a copper layer, a palladium layer, or a gold layer.

The intermediate metal layer 28b may be a diffusion prevention layer that prevents diffusion of copper. A width of the intermediate metal layer 28b in the horizontal direction (the X direction and/or the Y direction) may be greater than that of widths of the lower metal layer 28a and the upper metal layer 28c in the horizontal direction (the X direction and/or the Y direction). The second substrate solder layer 34 may be formed of tin, a tin-copper alloy, or a tin-silver alloy. The second substrate solder layer 34 may surround a portion of the second substrate pillar 28 while surrounding the second wiring connection part 22. For example, the second substrate solder layer 34 may contact side surfaces of the lower metal layer 28a, contact top, side, and bottom surfaces of the intermediate metal layer 28b, contact side and bottom surfaces of the upper metal layer 28c, and contact surfaces of the second wiring connection part 22.

A third substrate connection part 42 electrically connected to the third wiring connection part 24 may be formed on the rear surface 44r of the interposer substrate 44. The third substrate connection part 42 may include a third substrate pillar 30 formed on the rear surface 44r of the interposer substrate 44, and a third substrate solder layer 36 formed on the third substrate pillar 30. The third substrate pillar 30 may be referred to as a third substrate bump. The third substrate solder layer 36 is soldered with the cover solder layer 24b constituting the third wiring connection part 24.

The third substrate pillar 30 may include a plurality of metal layers 30a, 30b, and 30c. The third substrate pillar 30 may be formed of the same material as the first substrate pillar 26. The plurality of metal layers 30a, 30b, and 30c may be selected from nickel (Ni), aluminum (Al), iron (Fe), copper (Cu), titanium (Ti), chromium (Cr), gold (Au), silver (Ag), palladium (Pd), and platinum (Pt).

The third substrate pillar 30 may include a lower metal layer 30a, an intermediate metal layer 30b, and an upper metal layer 30c. According to the present embodiment, the lower metal layer 30a may be a copper layer, the intermediate metal layer 30b may be a nickel layer, and the upper metal layer 30c may be a copper layer, a palladium layer, or a gold layer.

The intermediate metal layer 30b may be a diffusion prevention layer that prevents diffusion of copper. A width of the intermediate metal layer 30b in the horizontal direction (the X direction and/or the Y direction) may be greater than widths of each of the lower metal layer 30a and the upper metal layer 30c in the horizontal direction (the X direction and/or the Y direction). The third substrate solder layer 36 may be formed of tin, a tin-copper alloy, or a tin-silver alloy. The third substrate solder layer 36 may surround a portion of the third substrate pillar 30 while surrounding the third wiring connection part 24. For example, the third substrate solder layer 36 may contact side surfaces of the lower metal layer 30a, contact top, side, and bottom surfaces of the intermediate metal layer 30b, contact side and bottom surfaces of the upper metal layer 30c, and contact surfaces of the third wiring connection part 24.

The interposer substrate 44 may include a plurality of chip mounted areas CHA1, CHA2, and CHA3 separated from one another in a 2D manner. The interposer substrate 44 may include the plurality of chip mounted areas CHA1, CHA2, and CHA3 separated from one another in the first direction (X direction). The chip mounted areas CHA1, CHA2, and CHA3 may include a first chip mounted area CHA1 located at the center area, and second and third chip mounted areas CHA2 and CHA3 located at the perimeter area.

A first semiconductor chip 46 may be mounted on the first chip mounted area CHA1 of the interposer substrate 44. The first semiconductor chip 46 may be electrically connected to the interposer substrate 44 via a first chip connection pillar 52. The first chip connection pillar 52 may be referred to as a first chip connection bump. The first chip connection pillar 52 may be a plurality of first chip connection pillars 52.

The first semiconductor chip 46 may be a non-memory chip. The first semiconductor chip 46 may be a controller chip. The first semiconductor chip 46 may be a logic chip. The first semiconductor chip 46 may be a system on chip. The first semiconductor chip 46 may be an application-specific chip (or an application-specific semiconductor chip). The first chip connection pillar 52 may have the same structure as the first through third substrate pillars 26, 28, and 30.

A second semiconductor chip 48 may be mounted on the second chip mounted area CHA2 of the interposer substrate 44. The second semiconductor chip 48 may be electrically connected to the interposer substrate 44 via a second chip connection pillar 54. The second chip connection pillar 54 may be referred to as a second chip connection bump. The second chip connection pillar 54 may be a plurality of second chip connection pillars 54.

The second semiconductor chip 48 may be a memory chip. The second semiconductor chip 48 may be a high bandwidth memory (HBM) chip. The second chip connection pillar 54 may have the same structure as the first through third substrate pillars 26, 28, and 30.

A third semiconductor chip 50 may be mounted on the third chip mounted area CHA3 of the interposer substrate 44. The third semiconductor chip 50 may be electrically connected to the interposer substrate 44 via a third chip connection pillar 56. The third chip connection pillar 56 may be referred to as a third chip connection bump. The third chip connection pillar 56 may be a plurality of third chip connection pillars 56.

The third semiconductor chip 50 may be a memory chip. The third semiconductor chip 50 may be an HBM chip. The third chip connection pillar 56 may have the same structure as the first through third substrate pillars 26, 28, and 30.

Warpage may occur in the interposer substrate 44 during a package manufacturing process. According to the inventive concept, even when the interposer substrate 44 has warpage, the package substrate 10 includes the first through third wiring connection parts 20, 22, and 24 respectively including the wiring solder layer, the conductor 22a, and the conductor 24a, and thus the first through third chip connection pillars 52, 54, and 56 may be electrically reliably connected to the interposer substrate 44.

As shown in FIG. 1, the interposer substrate 44 may have cry face warpage with a center area convex above a perimeter area. According to the inventive concept, even when the interposer substrate 44 has cry face warpage, the package substrate 10 includes the second and third wiring connection parts 22 and 24 respectively including the conductors 22a and 24a, and thus the second and third chip connection pillars 54 and 56 may be electrically reliably connected to the interposer substrate 44.

It has been described above that the interposer substrate 44 according to the inventive concept has cry face warpage. However, the inventive concept is applicable even when the interposer substrate 44 has warpage in the shape of a smile face in which a center area is convex below a perimeter area (also referred to herein as smile face warpage).

For example, when the interposer substrate 44 receives stress due to warpage, the second and third wiring connection parts 22 and 24 including the conductors 22a and 24a are formed in the package substrate 10 in correspondence with a partial area of the interposer substrate 44 that receives stress, and thus the second and third chip connection pillars 54 and 56 may be electrically reliably connected to the interposer substrate 44.

Figure 4:
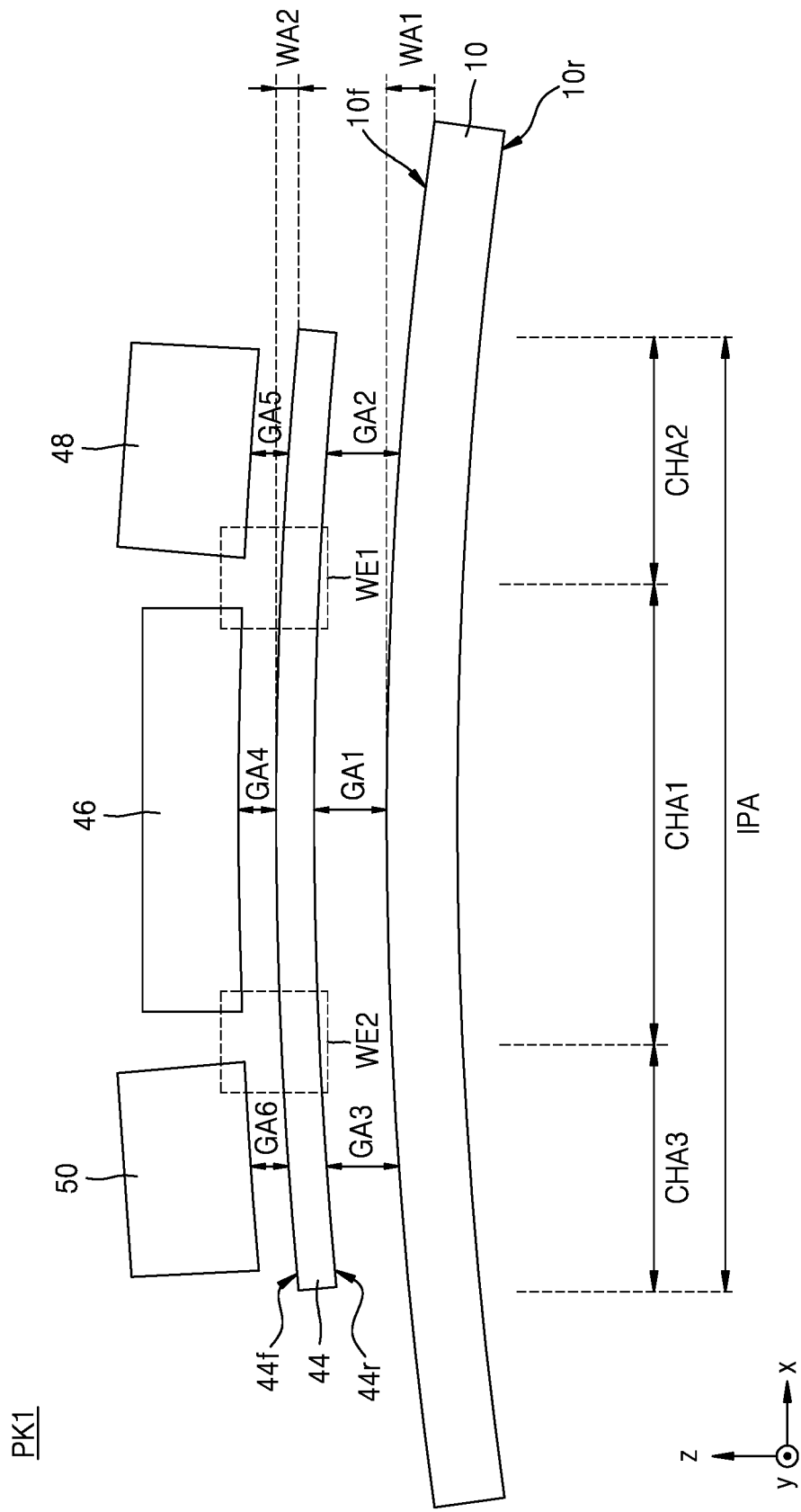
FIG. 4 is a cross-sectional view for explaining gaps between a package substrate, an interposer substrate, and semiconductor chips of FIGS. 1 and 2.

FIG. 4 is a cross-sectional view for explaining gaps between the package substrate 10, the interposer substrate 44, and the first, second, and third semiconductor chips 46, 48, and 50 of FIGS. 1 and 2.

In detail, the semiconductor package PK1 may include the package substrate 10 having the interposer mounted area IPA. The package substrate 10 may have a thickness of several hundred micrometers (um). According to the present embodiment, the package substrate 10 may have a thickness of 400 um to 800 um.

As a package manufacturing process proceeds, the package substrate 10 may form cry face warpage with a center area convex above a perimeter area. A distance in the vertical direction (Z direction) between the surface 10f of the package substrate 10 at the center area of the package substrate 10 and the surface 10f of the package substrate 10 at the perimeter area of the package substrate 10 may be defined as a first warpage value WA1. The first warpage value WA1 may have a positive value.

The semiconductor package PK1 may include the interposer substrate 44 having the chip mounted areas CHA1, CHA2, and CHA3. The interposer substrate 44 may include a first chip mounted area CHA1 located at the center area, and second and third chip mounted areas CHA2 and CHA3 located at the perimeter area on either side of the center area.

The interposer substrate 44 may have a small thickness of several micrometers (um). The interposer substrate 44 may have a large length of several tens of millimeters (mm). According to the present embodiment, the interposer substrate 44 may have a small thickness of 200 um to 400 um and may have a large length of 10 mm to 20 mm. Because the interposer substrate 44 has the small thickness and the large length, warpage may not occur as a package manufacturing process proceeds.

A distance in the vertical direction (Z direction) between the surface 44f of the interposer substrate 44 at the center area of the interposer substrate 44 and the surface 44f of the interposer substrate 44 at the perimeter area of the interposer substrate 44 may be defined as a second warpage value WA2. The second warpage value WA2 may have a positive value.

The semiconductor package PK1 may include the first semiconductor chip 46 mounted on the first chip mounted area CHA1, and the second semiconductor chip 48 and the third semiconductor chip 50 mounted on the second and third chip mounted areas CHA2 and CHA3, respectively. Although the second warpage value WA2 is less than the first warpage value WA1 in FIG. 4, the second warpage value WA2 may be greater than the first warpage value WA1 due to the second semiconductor chip 48 and the third semiconductor chip 50 mounted on the interposer substrate 44.

The semiconductor package PK1 may have first through third gaps GA1, GA2, and GA3 between the package substrate 10 and the interposer substrate 44. The first gap GA1 may be between the package substrate 10 and the interposer substrate 44 in the center area of the package substrate 10, and the second and third gaps GA2 and GA3 may be between the package substrate 10 and the interposer substrate 44 in the perimeter area of the package substrate 10.

According to warpage of the package substrate 10 and the interposer substrate 44, each of the second and third gaps GA2 and GA3 may be greater than the first gap GA1. The first through third gaps GA1, GA2, and GA3 may be each several tens of micrometers (um). According to the present embodiment, the first through third gaps GA1, GA2, and GA3 may be each 40 um to 60 um.

The semiconductor package PK1 may have fourth through sixth gaps GA4, GA5, and GA6 between the interposer substrate 44 and the first through third semiconductor chips 46, 48, and 50, respectively. The fourth gap GA4 may be between the interposer substrate 44 and the first semiconductor chip 46 in the center area of the interposer substrate 44, and the fifth and sixth gaps GA5 and GA6 may be between the interposer substrate 44 and the second and third semiconductor chips 48 and 50 in the perimeter area of the interposer substrate 44, respectively.

According to warpage of the interposer substrate 44, each of the fifth and sixth gaps GA5 and GA6 may be greater than the fourth gap GA4. The fourth through sixth gaps GA4, GA5, GA6 may be each several tens of micrometers (um). According to the present embodiment, the fourth through sixth gaps GA4, GA5, and GA6 may be each 20 um to 40 um.

The semiconductor package PK1 may have warpage in the interposer substrate 44 having a small thickness and a large length. In the semiconductor package PK1 according to the inventive concept, stress caused by warpage occurring in the interposer substrate 44 may be prevented by the second and third wiring connection parts 22 and 24 including the conductors 22a and 24a of the package substrate 10.

Accordingly, in the semiconductor package PK1, the first chip connection pillar 52 of FIG. 1 may be reliably electrically connected to the interposer substrate 44 in edge areas of the first semiconductor chip 46 indicated by reference characters WE1 and WE2.

In the semiconductor package PK1, the second and third chip connection pillars 54 and 56 of FIG. 1 may be reliably electrically connected to the interposer substrate 44 in edge areas of the second and third semiconductor chips 48 and 50 indicated by reference characters WE1 and WE2.

Figure 5A:
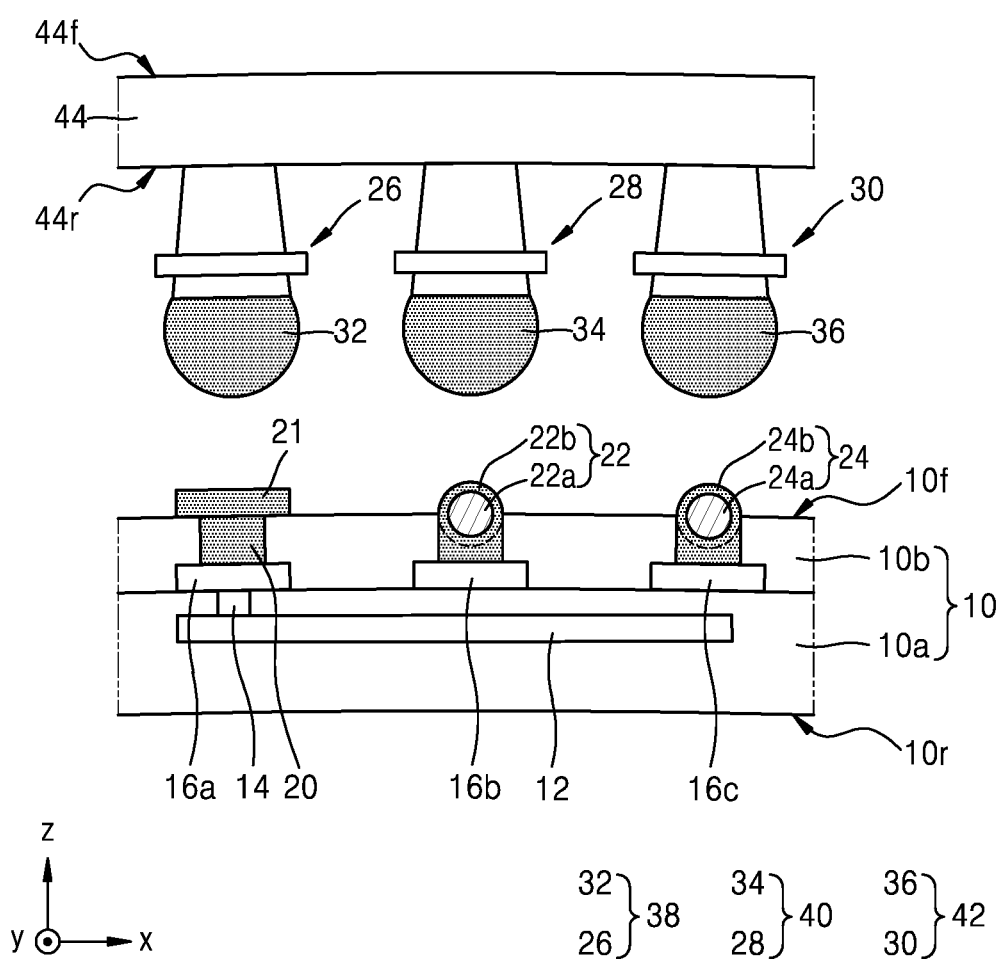
FIGS. 5A and 5B are cross-sectional views for explaining a process of bonding wiring connection parts of the package substrate of FIGS. 1 and 2 with substrate pillars of the interposer substrate of FIGS. 1 and 2.
Figure 5B:
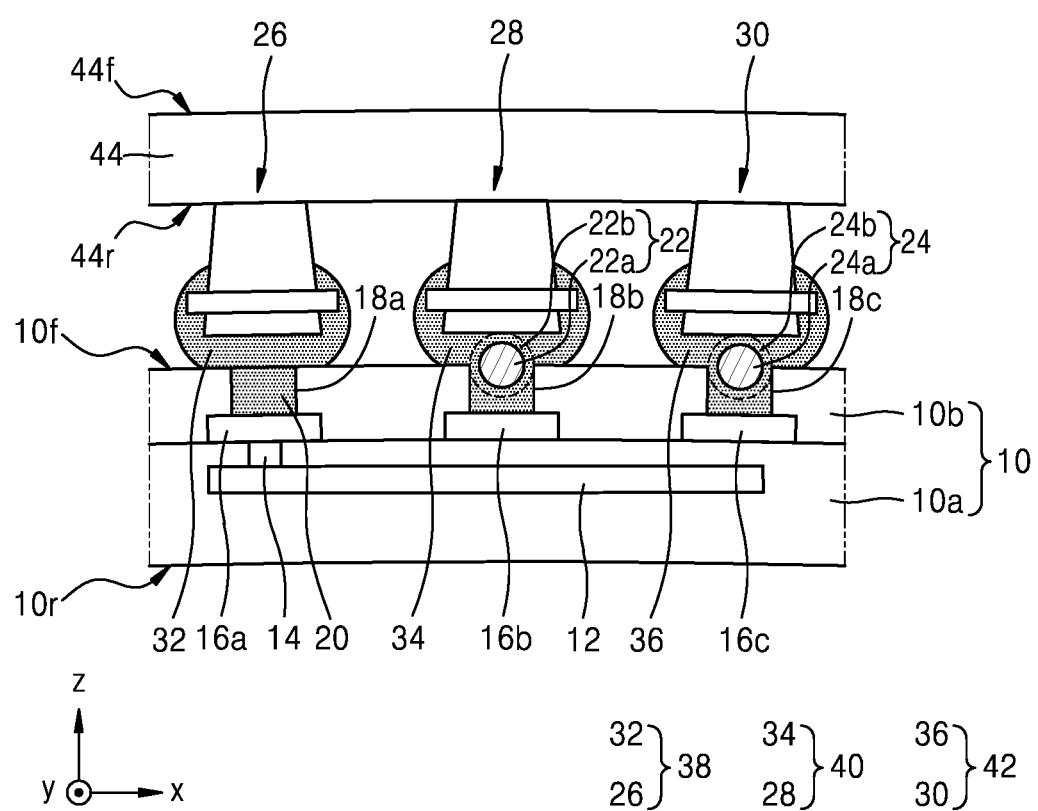

FIGS. 5A and 5B are cross-sectional views for explaining a process of bonding the first, second, and third wiring connection parts 20, 22, and 24 of the package substrate 10 of FIGS. 1 and 2 with the first, second, and third substrate pillars 26, 28, and 30 of the interposer substrate 44 of FIGS. 1 and 2.

Referring to FIG. 5A, as described above, the package substrate 10 may be prepared. The first wiring pad 16a, the second wiring pad 16b, and the third wiring pad 16c spaced apart from each other in a 2D manner may be included within the package substrate 10. The first wiring pad 16a, the second wiring pad 16b, and the third wiring pad 16c may be connected to the wiring layers 12 and 14.

The first wiring connection part 20 is formed on the first wiring pad 16a. The first wiring connection part 20 may be formed using a wiring solder layer. In some cases, a wiring connection pad 21 may be formed on the first wiring connection part 20. The wiring connection pad 21 may be formed using a wiring solder layer.

The second wiring connection part 22 is formed on the second wiring pad 16b. The second wiring connection part 22 may include the conductor 22a formed using a conductive core ball, and the cover solder layer 22b. An upper portion of the second wiring connection part 22 protrudes from the surface 10f of the package substrate 10.

The third wiring connection part 24 is formed on the third wiring pad 16c. The third wiring connection part 24 may include the conductor 24a formed using a conductive core ball, and the cover solder layer 24b. An upper portion of the third wiring connection part 24 protrudes from the surface 10f of the package substrate 10.

Then, the interposer substrate 44 is prepared over the package substrate 10 including the first wiring connection part 20, the second wiring connection part 22, and the third wiring connection part 24. The first substrate connection part 38 corresponding to the first wiring connection part 20 is formed on the rear surface 44r of the interposer substrate 44. The first substrate connection part 38 may include the first substrate pillar 26, and the first substrate solder layer 32 formed on the first substrate pillar 26.

The second substrate connection part 40 corresponding to the second wiring connection part 22 is formed on the rear surface 44r of the interposer substrate 44. The second substrate connection part 40 may include the second substrate pillar 28, and the second substrate solder layer 34 formed on the second substrate pillar 28.

The third substrate connection part 42 corresponding to the third wiring connection part 24 is formed on the rear surface 44r of the interposer substrate 44. The third substrate connection part 42 may include the third substrate pillar 30, and the third substrate solder layer 36 formed on the third substrate pillar 30.

Referring to FIG. 5B, the interposer substrate 44 and the package substrate 10 are soldering-bonded with each other. The first substrate connection part 38, the second substrate connection part 40, and the third substrate connection part 42 of the interposer substrate 44 are soldering-bonded with the first wiring connection part 20, the second wiring connection part 22, and the third wiring connection part 24 of the package substrate 10, respectively.

The interposer substrate 44 and the package substrate 10 may be soldering-bonded with each other via a reflow process. The first substrate solder layer 32, the second substrate solder layer 34, and the third substrate solder layer 36 of the first substrate connection part 38, the second substrate connection part 40, and the third substrate connection part 42 may be soldering-bonded with the first wiring connection part 20 (i.e., a wiring solder layer) and the wiring connection pad 21, the cover solder layer 22b of the second wiring connection part 22, and the cover solder layer 24b of the third wiring connection part 24, respectively.

Figure 6:
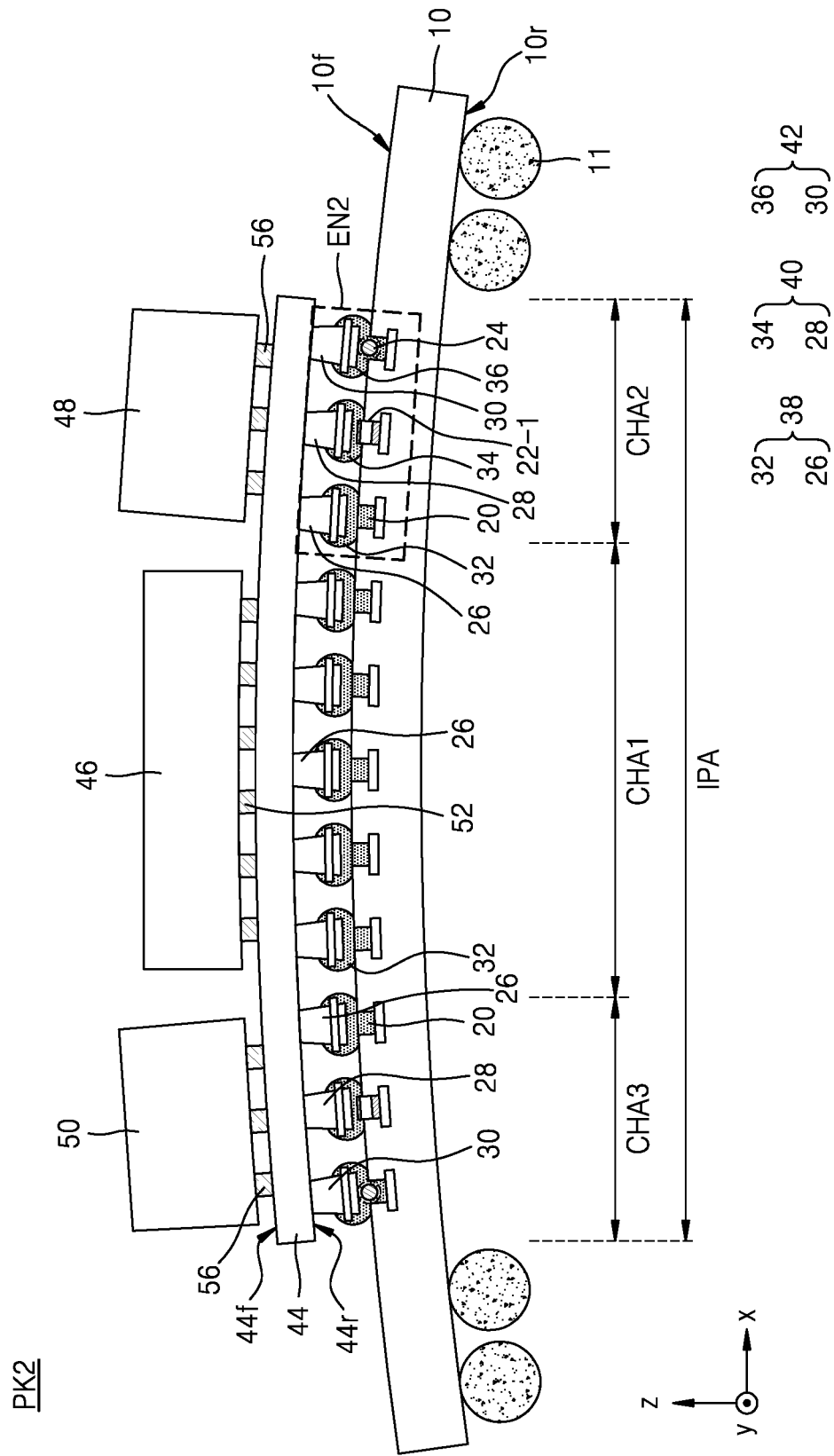
FIG. 6 is a cross-sectional view of a semiconductor package, according to an example embodiment of the inventive concept.
Figure 7:
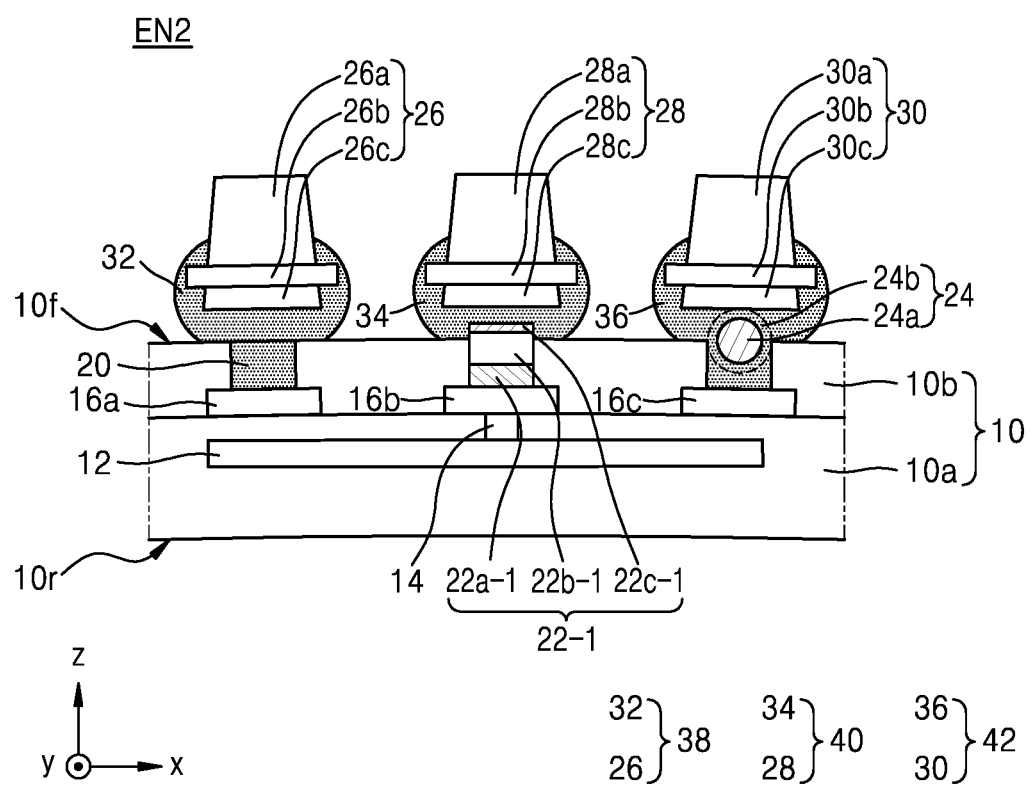
FIG. 7 is a magnified view of a portion EN2 of FIG. 6.

FIG. 6 is a cross-sectional view of a semiconductor package PK2 according to an example embodiment of the inventive concept, and FIG. 7 is a magnified view of a portion EN2 of FIG. 6.

In detail, the semiconductor package PK2 may be the same as the semiconductor package PK1 of FIGS. 1 through 4 except for a structure of a second wiring connection part 22-1. In FIGS. 6 and 7, reference numerals similar to or the same as FIGS. 1 through 4 indicate the same or similar members. Descriptions of FIGS. 1 through 4 will be omitted or briefly given below in FIGS. 6 and 7.

The semiconductor package PK2 may include the package substrate 10, the interposer substrate 44, and the first through third semiconductor chips 46, 48, and 50. The package substrate 10 may have the interposer mounted area IPA. The first wiring pad 16a, the second wiring pad 16b, and the third wiring pad 16c spaced apart from each other in a 2D manner may be included within the package substrate 10. The first wiring pad 16a may be arranged on a center area of the package substrate 10. The second wiring pad 16b and the third wiring pad 16c may be arranged on the perimeter area of the package substrate 10.

The first wiring connection part 20 is formed on the first wiring pad 16a. The first wiring connection part 20 may be formed using a wiring solder layer. The wiring solder layer may be formed of tin, a tin-copper alloy, or a tin-silver alloy. The first wiring pad 16a and the first wiring connection part 20 may constitute the first pad structure (16a, 20).

The second wiring connection part 22-1 is formed on the second wiring pad 16b. The second wiring connection part 22-1 may be arranged on the perimeter area of the surface 10f of the package substrate 10. The second wiring connection part 22-1 may be a wiring pillar including conductors 22a-1, 22b-1, and 22c-1. The conductors 22a-1, 22b-1, and 22c-1 may include a plurality of metal layers.

The conductors 22a-1, 22b-1, and 22c-1 may be selected from nickel (Ni), aluminum (Al), iron (Fe), copper (Cu), titanium (Ti), chromium (Cr), gold (Au), silver (Ag), palladium (Pd), and platinum (Pt). According to the present embodiment, the conductor 22a-1 may be a nickel layer, the conductor 22b-1 may be a copper layer, and the conductor 22c-1 may be a gold layer. The second wiring pad 16b and the second wiring connection part 22-1 may constitute a second pad structure (16b, 22-1).

The third wiring connection part 24 is formed on the third wiring pad 16c. The third wiring connection part 24 may be arranged on the perimeter area of the surface 10f of the package substrate 10. The third wiring connection part 24 may include the conductor 24a. The conductor 24a may be a conductive core ball, for example, a metal core ball.

The metal core ball may be a copper ball. The third wiring connection part 24 may include the conductor 24a, and the cover solder layer 24b buried in the third recess hole 18c while surrounding the conductor 24a. The third wiring pad 16c and the third wiring connection part 24 may constitute the third pad structure (16c, 24).

In FIGS. 6 and 7, the third wiring connection part 24 includes a conductive core ball. However, in some cases, the third wiring connection part 24 may include a wiring pillar, similar to the second wiring connection part 22-1. The semiconductor package PK2 may include the second pad structure (16b, 22-1) and the third pad structure (16c, 24) as different structures from the first pad structure (16a, 20).

The interposer substrate 44 may be mounted on the first wiring connection part 20, the second wiring connection part 22-1, and the third wiring connection part 24. The first substrate connection part 38 electrically connected to the first wiring connection part 20 may be formed on the rear surface 44r of the interposer substrate 44. The first substrate connection part 38 may include the first substrate pillar 26, and the first substrate solder layer 32 formed on the first substrate pillar 26.

A second substrate connection part 40 electrically connected to the second wiring connection part 22-1 may be formed on the rear surface 44r of the interposer substrate 44. The second substrate connection part 40 may include the second substrate pillar 28, and the second substrate solder layer 34 formed on the second substrate pillar 28.

The third substrate connection part 42 electrically connected to the third wiring connection part 24 may be formed on the rear surface 44r of the interposer substrate 44. The third substrate connection part 42 may include the third substrate pillar 30, and the third substrate solder layer 36 formed on the third substrate pillar 30.

The interposer substrate 44 may include the plurality of chip mounted areas CHA1, CHA2, and CHA3 separated from one another in a 2D manner. The chip mounted areas CHA1, CHA2, and CHA3 may include the first chip mounted area CHA1 located at the center area, and the second and third chip mounted areas CHA2 and CHA3 located at the perimeter area.

The first semiconductor chip 46 may be mounted on the first chip mounted area CHA1 of the interposer substrate 44. The first semiconductor chip 46 may be electrically connected to the interposer substrate 44 via the first chip connection pillar 52.

The second semiconductor chip 48 may be mounted on the second chip mounted area CHA2 of the interposer substrate 44. The second semiconductor chip 48 may be electrically connected to the interposer substrate 44 via the second chip connection pillar 54.

The third semiconductor chip 50 may be mounted on the third chip mounted area CHA3 of the interposer substrate 44. The third semiconductor chip 50 may be electrically connected to the interposer substrate 44 via the third chip connection pillar 56.

Warpage may occur in the interposer substrate 44 during a package manufacturing process. According to the inventive concept, even when the interposer substrate 44 has warpage, The package substrate 10 includes the first through third wiring connection parts 20, 22-1, and 24 respectively including the wiring solder layer, the conductors 22a-1, 22b-1, and 22c-1, and the conductor 24a, and thus the first through third chip connection pillars 52, 54, and 56 may be electrically reliably connected to the interposer substrate 44.

Figure 8A:
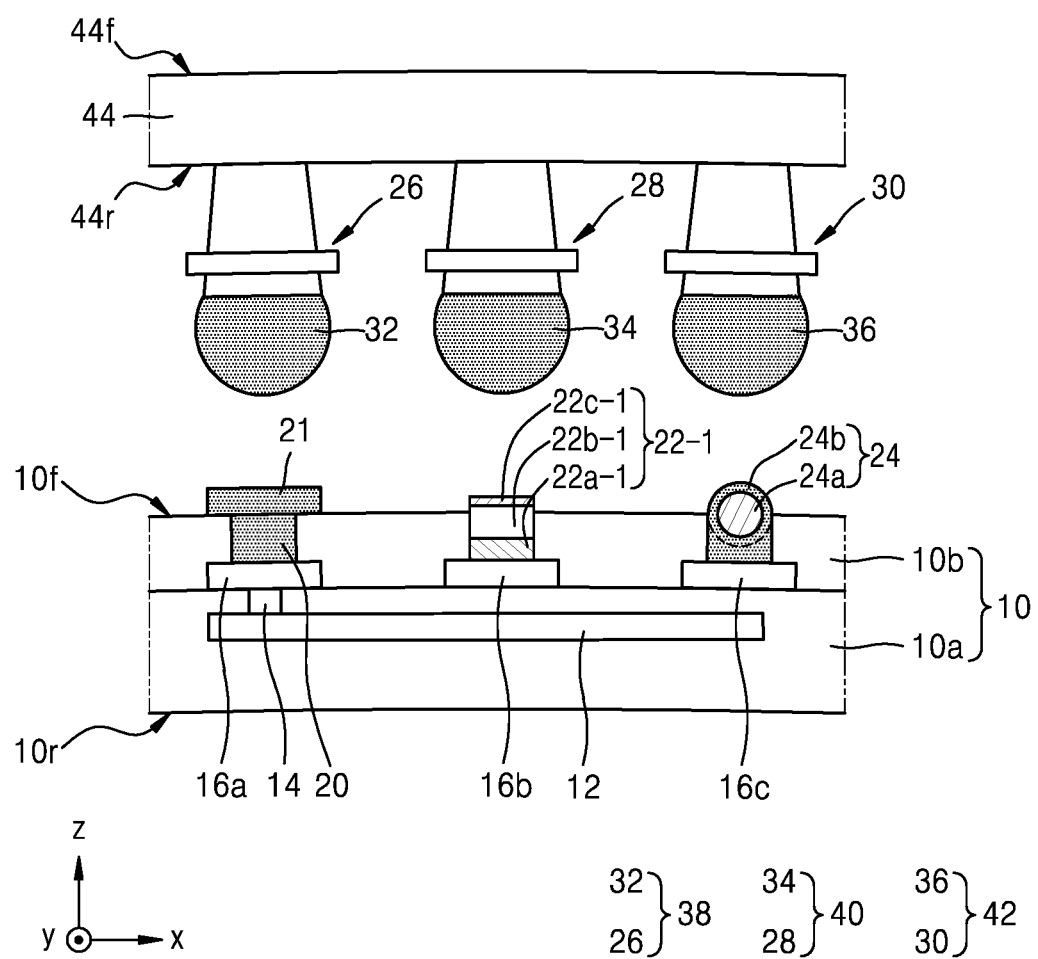
FIGS. 8A and 8B are cross-sectional views for explaining a process of bonding wiring connection parts of a package substrate of FIGS. 6 and 7 with substrate pillars of an interposer substrate of FIGS. 6 and 7.
Figure 8B:
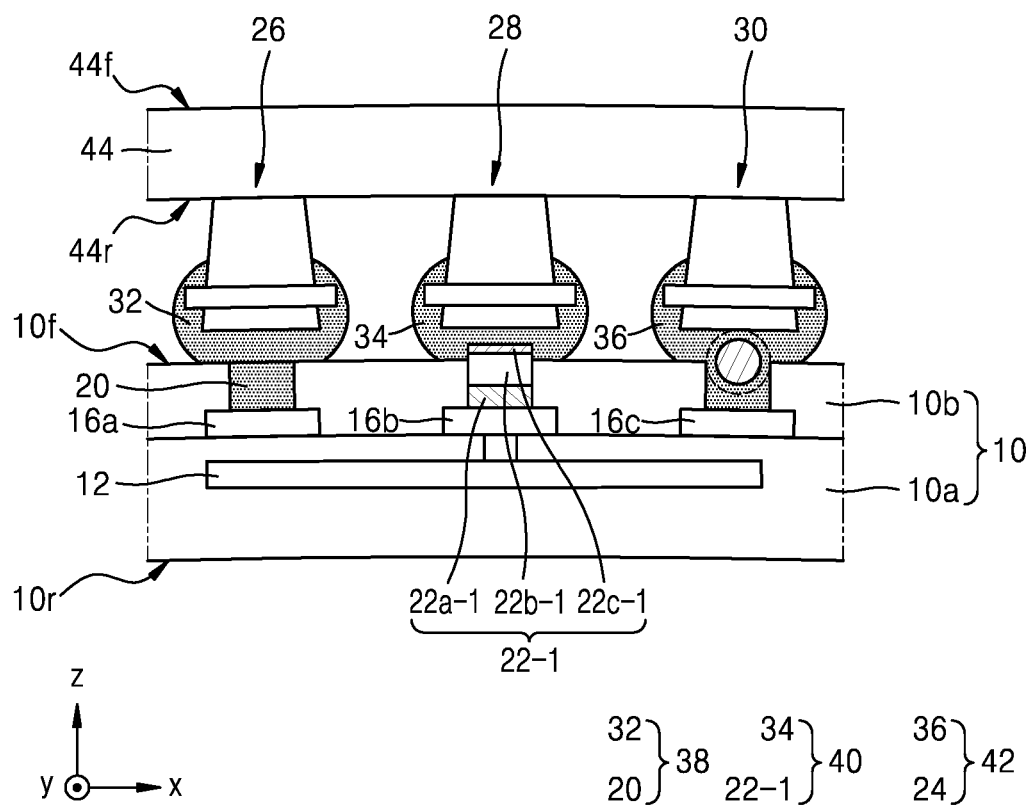

FIGS. 8A and 8B are cross-sectional views for explaining a process of bonding the first, second, and third wiring connection parts 20, 22-1, and 24 of the package substrate 10 of FIGS. 6 and 7 with the first, second, and third substrate pillars 26, 28, and 30 of the interposer substrate 44 of FIGS. 6 and 7.

Referring to FIG. 8A, as described above, the package substrate 10 may be prepared. The first wiring pad 16a, the second wiring pad 16b, and the third wiring pad 16c spaced apart from each other in a 2D manner may be included within the package substrate 10. The first wiring pad 16a, the second wiring pad 16b, and the third wiring pad 16c may be connected to the wiring layers 12 and 14.

The first wiring connection part 20 is formed on the first wiring pad 16a. The first wiring connection part 20 may be formed using a wiring solder layer. In some cases, the wiring connection pad 21 may be formed on the first wiring connection part 20. The wiring connection pad 21 may be formed using a wiring solder layer.

The second wiring connection part 22-1 is formed on the second wiring pad 16b. The second wiring connection part 22-1 may be a wiring pillar including the conductors 22a-1, 22b-1, and 22c-1. The conductors 22a-1, 22b-1, and 22c-1 may include a plurality of metal layers. An upper portion of the second wiring connection part 22-1 protrudes from the surface 10f of the package substrate 10.

The third wiring connection part 24 is formed on the third wiring pad 16c. The third wiring connection part 24 may include the conductor 24a formed using a conductive core ball, and the cover solder layer 24b. An upper portion of the third wiring connection part 24 protrudes from the surface 10f of the package substrate 10.

Then, the interposer substrate 44 is prepared over the package substrate 10 including the first wiring connection part 20, the second wiring connection part 22-1, and the third wiring connection part 24. The first substrate connection part 38 corresponding to the first wiring connection part 20 is formed on the rear surface 44r of the interposer substrate 44. The first substrate connection part 38 may include the first substrate pillar 26, and the first substrate solder layer 32 formed on the first substrate pillar 26.

The second substrate connection part 40 corresponding to the second wiring connection part 22-1 is formed on the rear surface 44r of the interposer substrate 44. The second substrate connection part 40 may include the second substrate pillar 28, and the second substrate solder layer 34 formed on the second substrate pillar 28.

The third substrate connection part 42 corresponding to the third wiring connection part 24 is formed on the rear surface 44r of the interposer substrate 44. The third substrate connection part 42 may include the third substrate pillar 30, and the third substrate solder layer 36 formed on the third substrate pillar 30.

Referring to FIG. 8B, the interposer substrate 44 and the package substrate 10 are bonded with each other. The first substrate connection part 38, the second substrate connection part 40, and the third substrate connection part 42 of the interposer substrate 44 are bonded with the first wiring connection part 20, the second wiring connection part 22-1, and the third wiring connection part 24 of the package substrate 10, respectively.

The interposer substrate 44 and the package substrate 10 may be bonded with each other via a reflow process. The first substrate solder layer 32, the second substrate solder layer 34, and the third substrate solder layer 36 of the first substrate connection part 38, the second substrate connection part 40, and the third substrate connection part 42 may be bonded with the first wiring connection part 20 and the wiring connection pad 21, the second wiring connection part 22-1, and the third wiring connection part 24, respectively.

Figure 9:
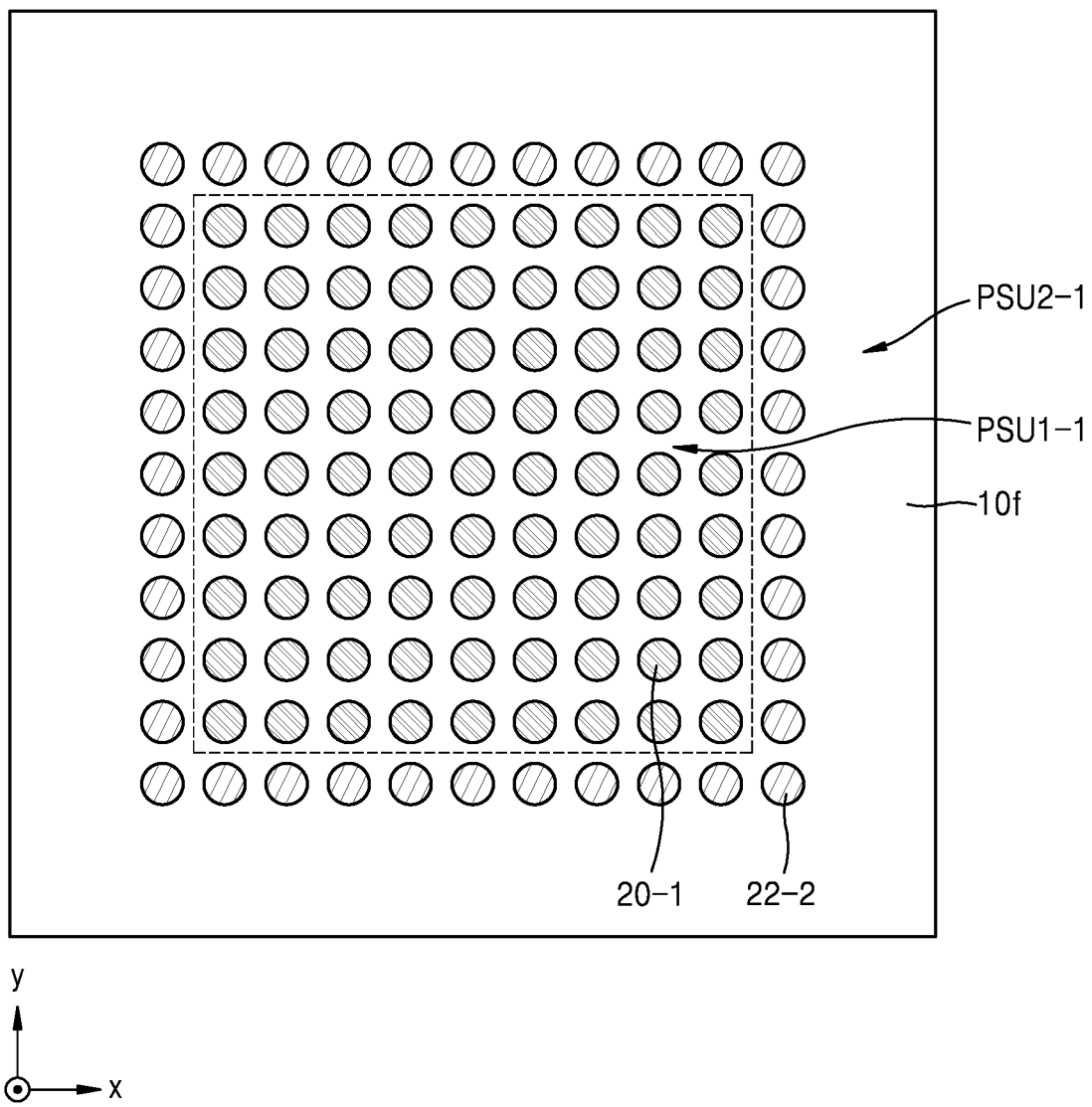
FIG. 9 is a plan view of a package substrate usable in a semiconductor package, according to an example embodiment of the inventive concept.

FIG. 9 is a plan view of a package substrate 10-1 usable in a semiconductor package according to an example embodiment of the inventive concept.

In detail, the package substrate 10-1 may be the same as the package substrate 10 of FIG. 3 except for layout of second wiring connection parts 22-2. In FIG. 9, reference numerals similar to or the same as FIGS. 1 through 3 may indicate the same or similar members.

A first wiring connection part 20-1 may be arranged on a center area PSU1-1 of the package substrate 10-1. The first wiring connection part 20-1 may have the same structure as the first wiring connection part 20 of FIGS. 1 and 2. A plurality of first wiring connection parts 20-1 may be arranged apart from one another on the center area PSU1-1 of the package substrate 10.

A second wiring connection part 22-2 may be arranged on a perimeter area PSU2-1 of the package substrate 10. The second wiring connection part 22-2 may have the same structure as the second wiring connection part 22 of FIGS. 1 and 2. A plurality of second wiring connection parts 22-2 may be arranged around the center area PSU1-1 of the package substrate 10. The plurality of second wiring connection parts 22-2 may be spaced apart from one another.

Figure 10:
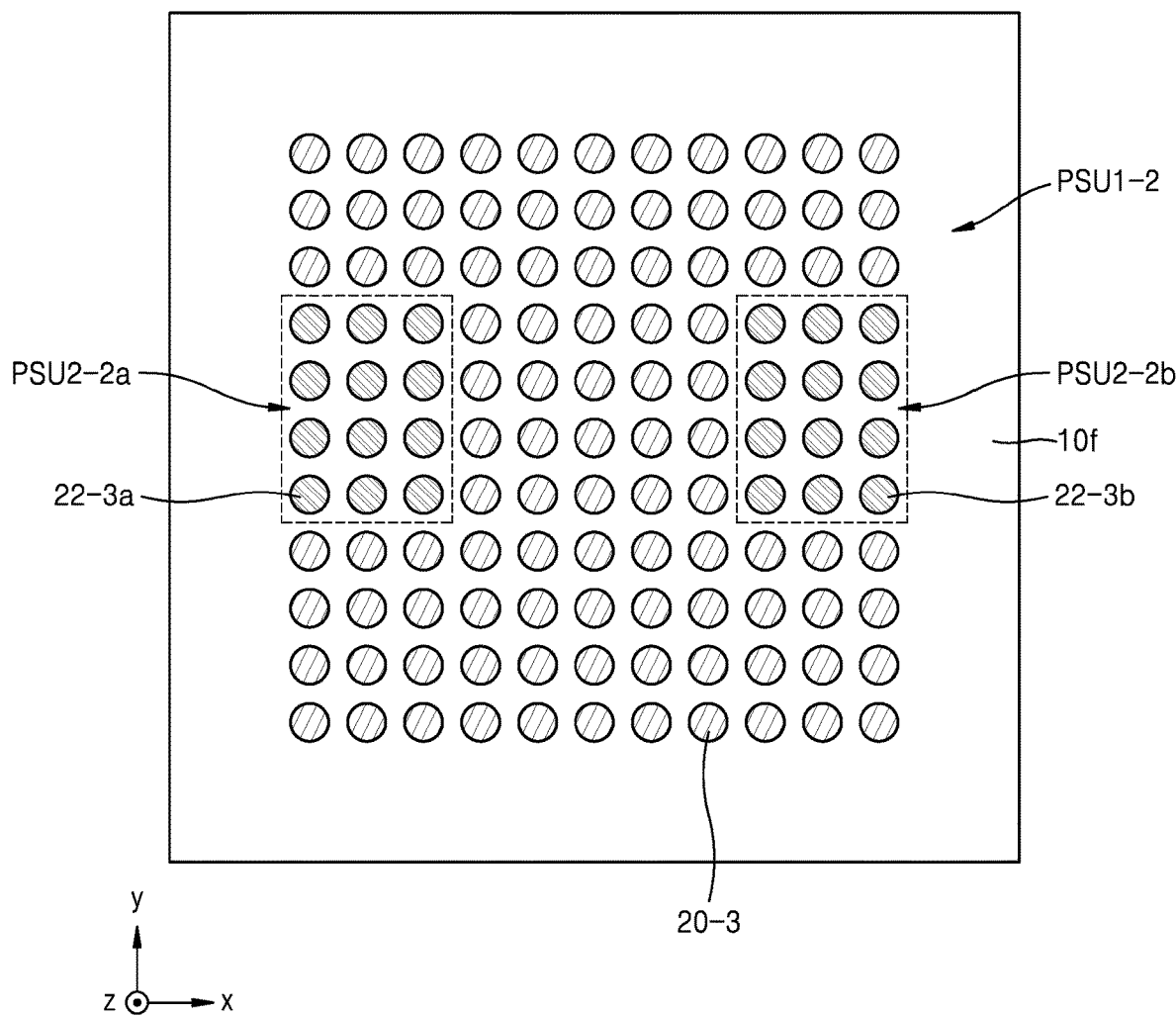
FIG. 10 is a plan view of a package substrate usable in a semiconductor package, according to an example embodiment of the inventive concept.

FIG. 10 is a plan view of a package substrate 10-2 usable in a semiconductor package according to an example embodiment of the inventive concept.

In detail, the package substrate 10-2 may be the same as the package substrate 10 of FIG. 3 except for layout of second wiring connection parts 22-3a and 22-3b. In FIG. 10, reference numerals similar to or the same as FIGS. 1 through 3 may indicate the same or similar members.

A first wiring connection part 20-3 may be arranged on a center and perimeter area PSU1-2 of the package substrate 10-1. The first wiring connection part 20-3 may have the same structure as the first wiring connection part 20 of FIGS. 1 and 2. A plurality of first wiring connection parts 20-3 may be arranged apart from one another on the center and perimeter area P SU1-2 of the package substrate 10.

The second wiring connection parts 22-3a and 22-3b may be arranged on left and right perimeter areas PSU2-2a and PSU2-2b of the package substrate 10-2. The second wiring connection parts 22-3a and 22-3b may have the same structure as the second wiring connection part 22 of FIGS. 1 and 2.

The second wiring connection part 22-3a may be arranged on the left perimeter area PSU2-2a of the package substrate 10. A plurality of second wiring connection parts 22-3a may be spaced apart from one another. The second wiring connection part 22-3b may be arranged on the right perimeter area PSU2-2b of the package substrate 10. A plurality of second wiring connection parts 22-3b may be spaced apart from one another.

Figure 11:
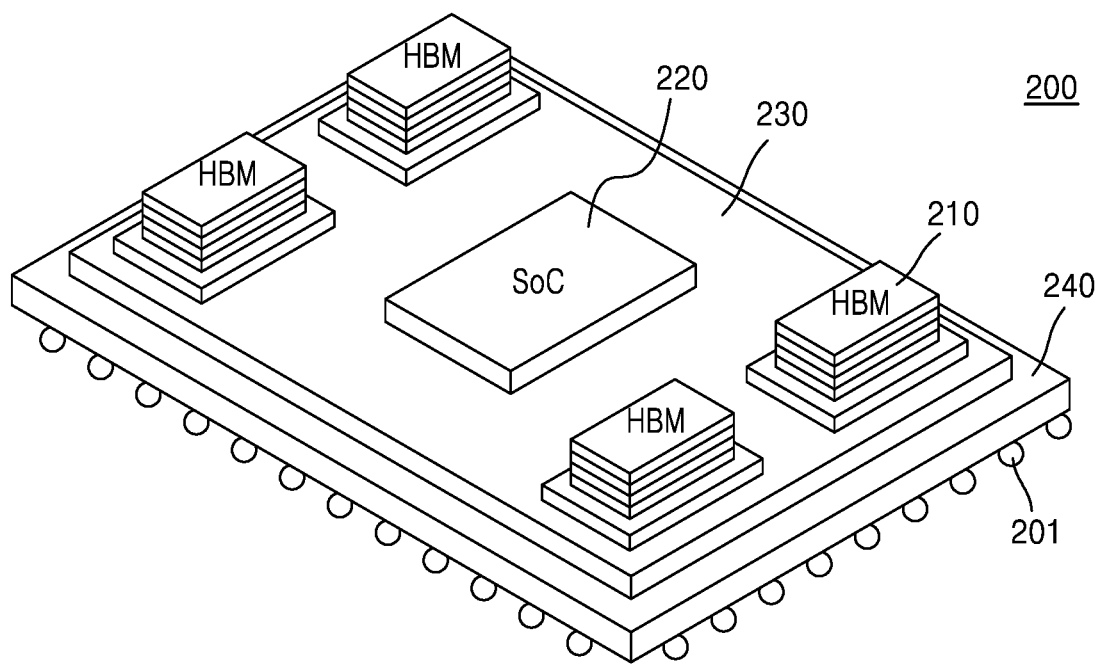
FIG. 11 is a perspective view of a semiconductor package, according to an example embodiment of the inventive concept.

FIG. 11 is a perspective view of a semiconductor package 200 according to an example embodiment of the inventive concept.

In detail, the semiconductor package 200 may include a plurality of stacked memory chips 210 and a system on chip (SoC) 220. The stacked memory chips 210 may correspond to the second and third semiconductor chips 48 and 50 of FIGS. 1 and 6, and the SoC 220 may correspond to the first semiconductor chip 46 of FIGS. 1 and 6.

The stacked memory chips 210 and the SoC 220 may be stacked on an interposer substrate 230, and the interposer substrate 230 may be stacked on a package substrate 240. The interposer substrate 230 may correspond to the interposer substrate 44 of FIGS. 1 and 6, and the package substrate 240 may correspond to the package substrate 10 of FIGS. 1 and 6. The semiconductor package 200 may transmit or receive signals to or from another external package or semiconductor chips through solder balls 201 attached to a lower surface of the package substrate 240.

Each of the stacked memory chips 210 may be implemented based on the HBM standard. However, embodiments of the inventive concept are not limited thereto, and the stacked memory chips 210 may be implemented based on the GDDR, HMC, or Wide I/O standard.

The SoC 220 may include at least one processor such as a central processing unit (CPU), an application processor (AP), a graphics processing unit (GPU), and a neural processing unit (NPU), and a plurality of memory controllers for controlling the plurality of stacked memory chips 210. The SoC 220 may transmit or receive signals to or from corresponding stacked memory chips through the memory controllers.

Figure 12:
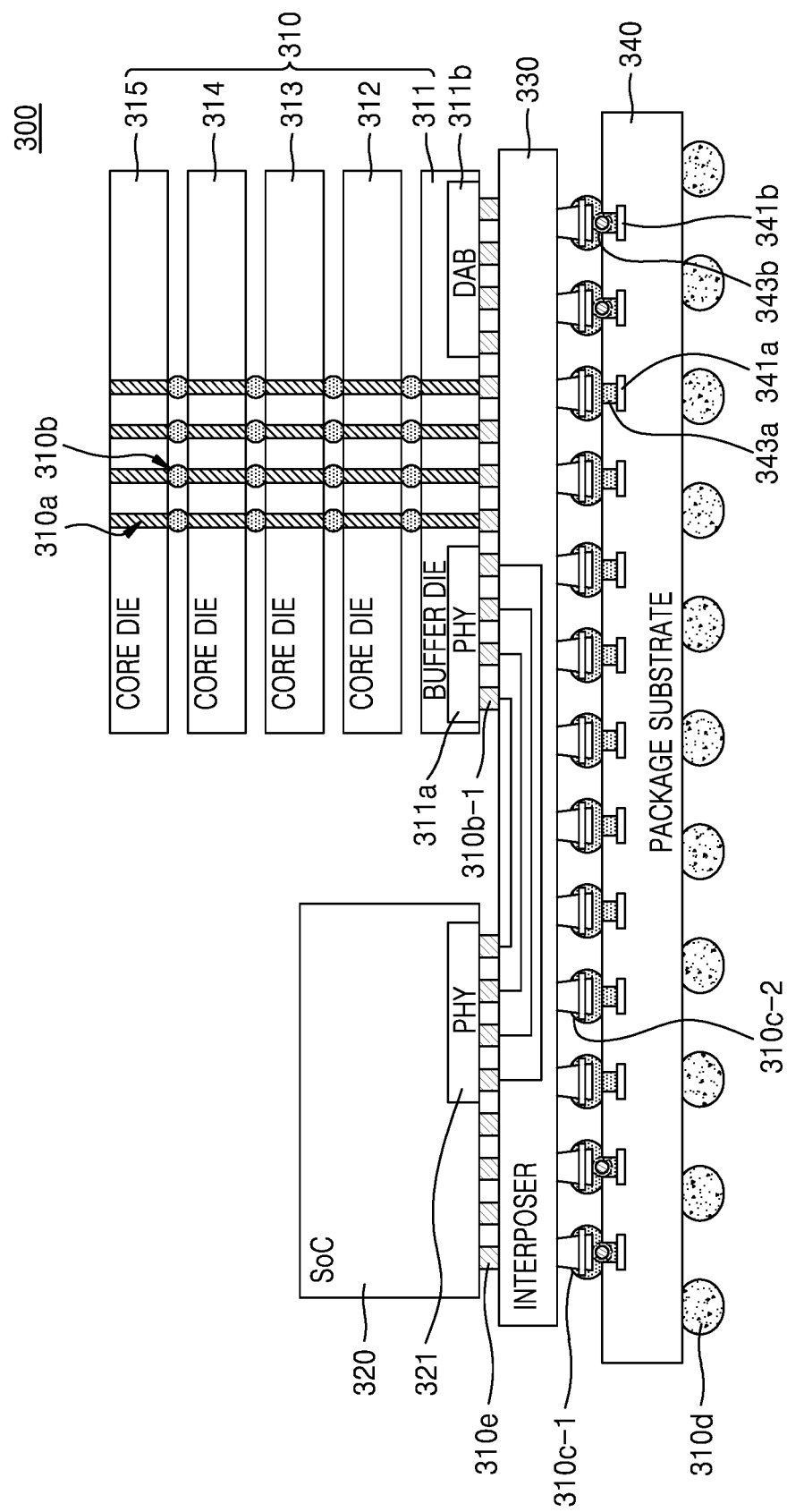
FIG. 12 illustrates a semiconductor package, according to an example embodiment of the inventive concept.

FIG. 12 illustrates a semiconductor package 300 according to an example embodiment of the inventive concept.

In detail, the semiconductor package 300 may include a stacked memory chip 310, an SoC 320, an interposer substrate 330, and a package substrate 340. The stacked memory chip 310 may correspond to the second and third semiconductor chips 48 and 50 of FIGS. 1 and 6, and the SoC 320 may correspond to the first semiconductor chip 46 of FIGS. 1 and 6.

The interposer substrate 330 may correspond to the interposer substrate 44 of FIGS. 1 and 6, and the package substrate 340 may correspond to the package substrate 10 of FIGS. 1 and 6. The stacked memory chip 310 may include a buffer die 311 and core dies 312 through 315.

Each of the core dies 312 through 315 may include memory cells for storing data. The buffer die 311 may include a physical layer 311a and a direct access area (DAB) 311b. The physical layer 311a may be electrically connected to a physical layer 321 of the SoC 320 via the interposer substrate 330. The stacked memory chip 310 may receive or transmit signals from or to the SoC 320 through the physical layer 311a.

The direct access area 311b may provide an access path capable of testing the stacked memory chip 310 rather than via the SoC 320. The direct access area 311b may include conductive means (e.g., a port or a pin) capable of communicating directly with an external test device. A test signal received through the direct access area 311b may be transmitted to the core dies 312 through 315 via through silicon vias (TSVs) 310a. Data read from the core dies 312 through 315 in order to test the core dies 312 through 315 may be transmitted to a test device through the TSVs 310a and the direct access area 311b. Accordingly, a direct access text may be performed on the core dies 312 through 315.

The buffer die 311 and the core dies 312 through 315 may be electrically connected to one another via the TSVs 310a and bumps 310b. The bumps 310b may be micro-bumps. The buffer die 311 may be connected to the interposer substrate 330 via connection pillars 310b-1. The buffer die 311 may receive signals provided to channels from the SoC 320 via the connection pillars 310b-1 respectively allocated for channels, or may transmit signals to the SoC 320 via the connection pillars 310b-1.

The SoC 320 may be connected to the interposer substrate 330 via connection pillars 310e. The connection pillars 310b-1 and 310e connected to the interposer substrate 330 may correspond to the chip connection pillars 52, 54, and 56 of FIGS. 1 and 6.

The SoC 320 may execute applications that are supported by the semiconductor package 300 by using the stacked memory chip 310. For example, the SoC 320 may execute specialized operations by including at least one processor such as a CPU, an AP, a GPU, an NPU, a tensor processing unit (TPU), a vision processing unit (VPU), an image signal processor (ISP), and a digital signal processor (DSP).

The SoC 320 may control overall operations of the stacked memory chip 310. The SoC 320 may include the physical layer 321. The physical layer 321 may include an interface circuit for transmitting or receiving signals to or from the physical layer 311a of the stacked memory chip 310. The SoC 320 may provide various signals to the physical layer 311a via the physical layer 321. Signals provided to the physical layer 311a may be transmitted to the core dies 312 through 315 via an interface circuit of the physical layer 311a and the TSVs 310a.

The interposer package 330 may connect the stacked memory chip 310 to the SoC 320. The interposer substrate 330 may connect the physical layer 311a of the stacked memory chip 310 to the physical layer 321 of the SoC 320, and may provide physical paths formed using conductive materials. Accordingly, the stacked memory chip 310 and the SoC 320 may be stacked on the interposer substrate 330 and transmit or receive signals to or from each other.

Substrate connection parts 310c-1 and 310c-2 may be formed below the interposer substrate 330, and solder balls 310d may be attached to a lower surface of the package substrate 340. The substrate connection parts 310c-1 and 310c-2 may correspond to the substrate connection parts 38, 40, and 42 of FIGS. 1 and 6. The interposer substrate 330 may be stacked on the package substrate 340 via the substrate connection parts 310c-1 and 310c-2.

As described above, pad structures including wiring pads 341a and 341b and wiring connection parts 343a and 343b may be arranged on the package substrate 340. The wiring pads 341a and 341b may correspond to the wiring pads 16a through 16c of FIGS. 1 and 6. The wiring connection parts 343a and 343b may correspond to the wiring connection parts 20, 22, and 24 of FIG. 1.

The semiconductor package 300 may transmit or receive signals to or from another external package or semiconductor chips through the solder balls 310d. For example, the package substrate 340 may be a printed circuit board (PCB).

Figure 13:
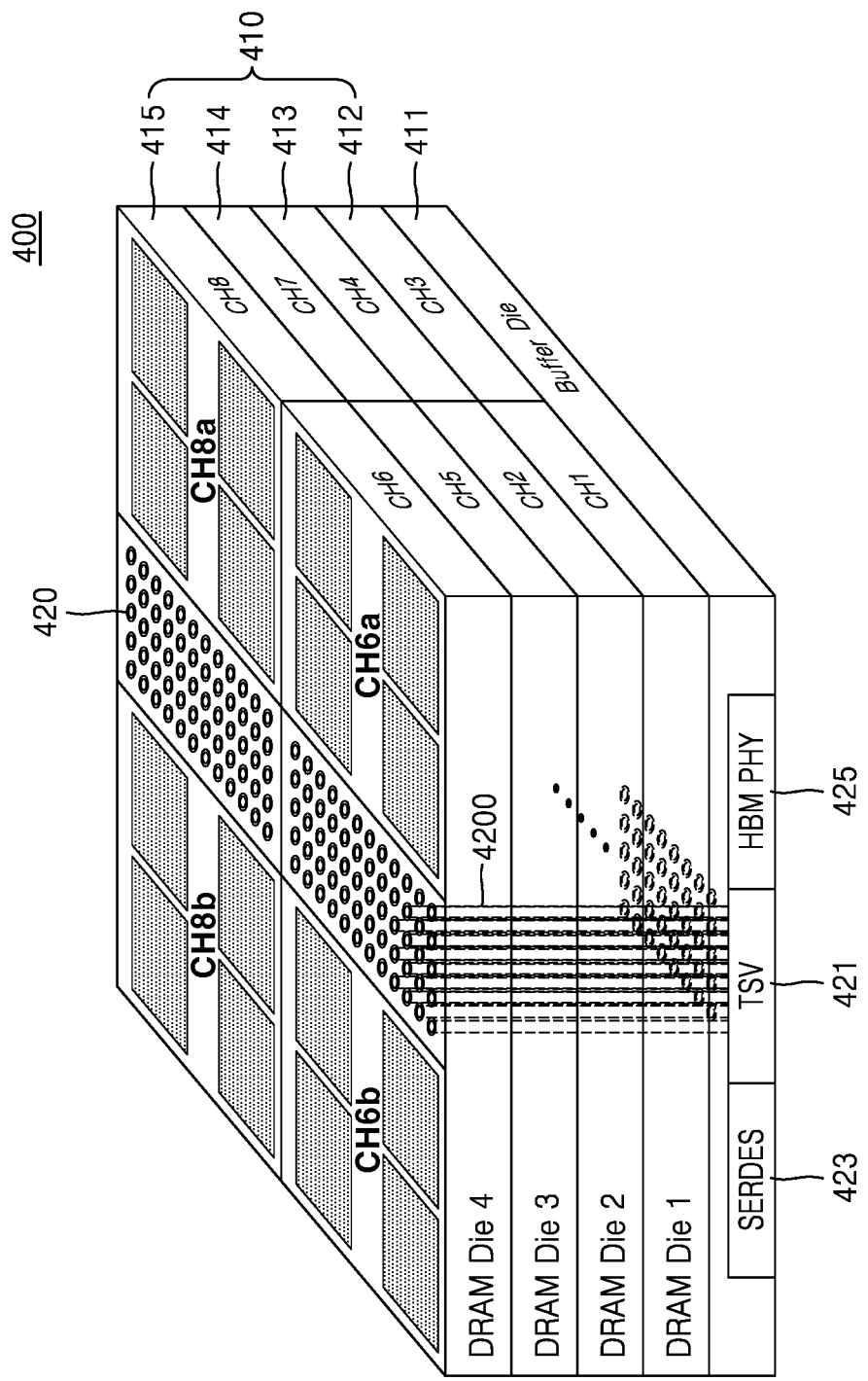
FIG. 13 illustrates a memory chip included in a semiconductor package, according to an example embodiment of the inventive concept.

FIG. 13 illustrates a memory chip 400 included in a semiconductor package according to an example embodiment of the inventive concept.

In detail, the memory chip 400 may be an HBM chip including a plurality of channels CH1 through CH8 having different interfaces. The memory chip 400 may correspond to the second and third semiconductor chips 48 and 50 of FIGS. 1 and 6. The memory chip 400 may include a plurality of dies, namely, a buffer die 411 and at least one DRAM die 410 stacked on the buffer die 411.

For example, a first DRAM die 412 may include a first channel CH1 and a third channel CH3, a second DRAM die 413 may include a second channel CH2 and a fourth channel CH4, a third DRAM die 414 may include a fifth channel CH5 and a seventh channel CH7, and a fourth DRAM die 415 may include a sixth channel CH6 and an eighth channel CH8.

The buffer die 411 may communicate with a CPU through conductive means, for example, bumps or solder balls, formed on an external surface of the memory chip 400. The buffer die 411 may receive a command, an address, and data from the CPU, and may provide the received command, address, and data to a channel of the at least one DRAM die 410. The buffer die 411 may provide data output by the channel of the at least one DRAM die 410 to the CPU.

The memory chip 400 may include a plurality of TSVs 420 penetrating through the first through fourth DRAM dies 412 through 415. When each of the first through eighth channels CH1 through CH8 has a bandwidth of 128 bits, the TSVs 420 may include components for inputting/outputting data of 1024 bits. Each of the channels CH1 through CH8 may be divided into left and right portions. For example, in the fourth DRAM die 415, the sixth channel CH6 may be divided into pseudo channels CH6a and CH6b and the eighth channel CH8 may be divided into pseudo channels CH8a and CH8b. The TSVs 420 may be arranged between the pseudo channels CH6a and CH6b of the sixth channel CH6 and may be arranged between the pseudo channels CH8a and CH8b of the eighth channel CH8.

The buffer die 411 may include a TSV area 421, a SERializer/DESerializer (SERDES) area 423, and an HBM PHYsical layer interface, namely, an HBM PHY area 425. In the TSV area 421, the TSVs 420 for communication with the at least one DRAM die 410 are formed.

In the SERDES area 423, as a processing throughput of a CPU increases and demands for a memory bandwidth increase, a SERDES interface of the Joint Electron Device Engineering Council (JEDEC) standard is provided. The SERDES area 423 may include a SERDES transmitter portion, a SERDES receiver portion, and a controller portion. The SERDES transmitter portion may include a parallel-to-serial circuit and a transmitter, and may receive a parallel data stream and serialize the received parallel data stream. The SERDES receiver portion may include a receiver amplifier, an equalizer, a clock and data recovery (CDR) circuit, and a serial-to-parallel circuit, and may receive a serial data stream and serialize the received serial data stream. The controller portion includes an error detection circuit, an error correction circuit, and registers such as a First In First Out (FIFO).

The HBM PHY area 425 may include a physical or electrical layer and a logical layer that are provided for signals, a frequency, timing, driving, detailed operation parameters, and functionality required for efficient communication between the CPU and the memory chip 400. The HBM PHY area 425 may perform memory interfacing such as selection of a row and a column corresponding to a memory cell, writing of data to the memory cell, or reading of the written data. The HBM PHY area 425 may support the features of an HBM protocol of the JEDEC standard. For example, the HBM PHY area 425 may perform data communication of a 64-bit size together with the CPU.

Figure 14:
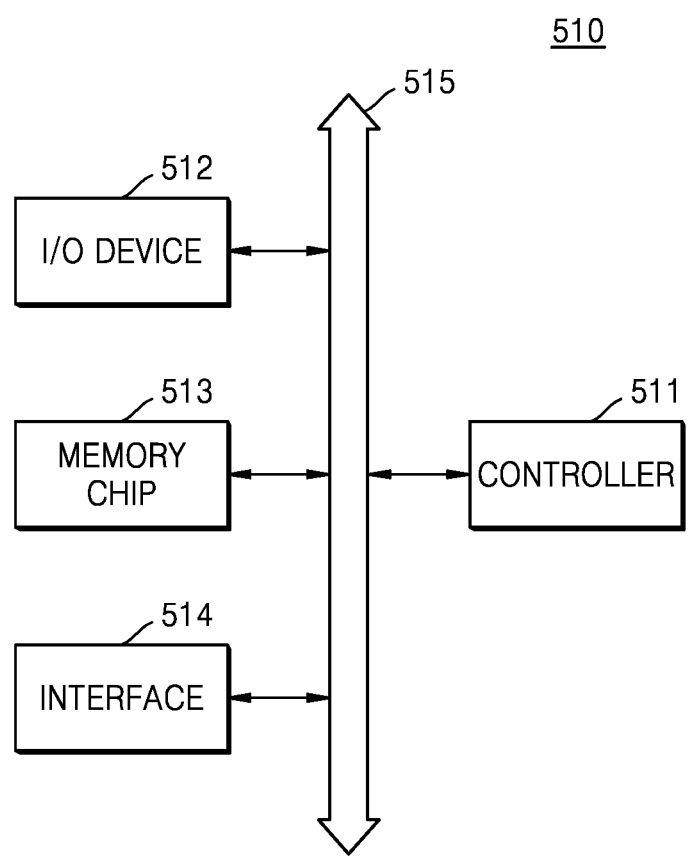
FIG. 14 is a schematic block diagram of a memory system including a semiconductor package, according to an example embodiment of the inventive concept.

FIG. 14 is a schematic block diagram of a memory system 510 including a semiconductor package according to an example embodiment of the inventive concept.

In detail, the memory system 510 is applicable to personal digital assistants (PDA), portable computers, web tablets, wireless phones, mobile phones, digital music players, memory cards, or all devices capable of transmitting and/or receiving information in a wireless environment.

The memory system 510 includes a controller 511, an input/output (I/O) device 512 (such as, for example, a key pad, a key board, and a display), a memory chip 513, an interface 514, and a bus 515. The memory chip 513 and the interface 514 communicates with each other via the bus 515.

The controller 511 includes at least one microprocessor, a digital signal processor, a microcontroller, or other devices similar to these devices. The memory chip 513 may be used to store commands executed by the controller 511. The I/O device 512 may receive data or a signal from the outside of the memory system 510 or output data or a signal to the outside of the memory system 510. For example, the I/O device 512 may include a keyboard, a keypad, or a display.

The memory chip 513 and the controller 511 may include the semiconductor packages PK1 and PK2 according to embodiments of the inventive concept. The interface 514 transmits data to a communication network or receives data from the communication network.

Figure 15:
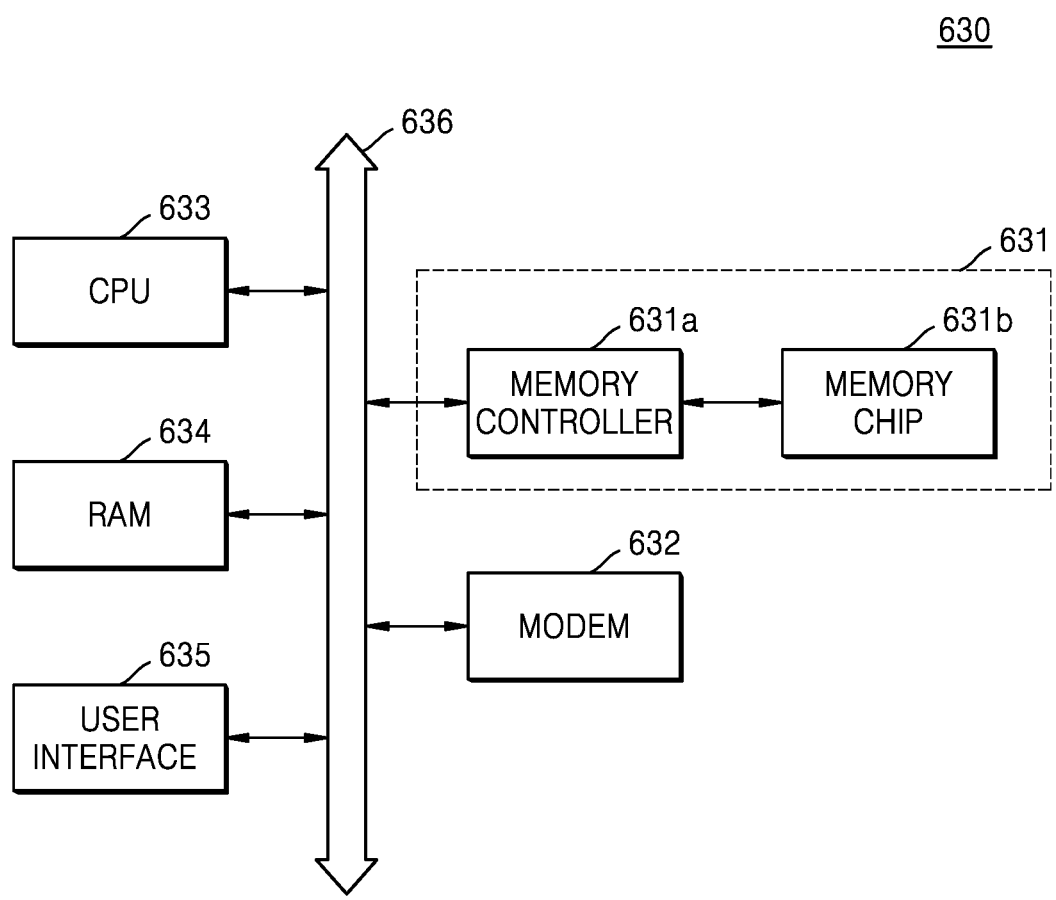
FIG. 15 is a schematic block diagram of an information processing system including a semiconductor package, according to an example embodiment of the inventive concept.

FIG. 15 is a schematic block diagram of an information processing system 630 including a semiconductor package according to an example embodiment of the inventive concept.

In detail, the information processing system 630 may be used in mobile devices or desktop computers. The information processing system 630 may include a memory system 631 including a memory controller 631a and a memory chip 631b.

The information processing system 630 includes a MOdulator and DEModulator (MODEM) 632, a CPU 633, a RAM 634, and a user interface 635 all electrically connected to a system bus 636. The memory system 631 stores data processed by the CPU 633 or data input from the outside.

The memory system 631 including the memory controller 631a and the memory chip 631b, the MODEM 632, and the CPU 633 may include the semiconductor packages PK1 and PK2 of FIGS. 1 and 6 according to embodiments of the inventive concept.

The memory system 631 may be formed using a solid state driver. In this case, the information processing system 630 may stably store large-capacity data in the memory system 631. With an increase in reliability, the memory system 631 may save resources required for error correction, and thus may provide a high-speed data exchange function to the information processing system 630. Although not shown in FIG. 15, it may be obvious to one of ordinary skill in the art that the information processing system 630 may be further provided with an application chipset, a camera ISP, an I/O device, etc.

While the inventive concept has been particularly shown and described with reference to embodiments thereof, it will be understood that various changes in form and details may be made therein without departing from the spirit and scope of the following claims.

What is claimed is:

1. A semiconductor package comprising:
   a first wiring pad formed on a package substrate;
   a first wiring connection part formed on the first wiring pad and including a wiring solder layer;
   a second wiring pad formed apart from the first wiring pad on the package substrate;
   a second wiring connection part formed on the second wiring pad and including a conductor;
   an interposer substrate mounted on the first wiring connection part and the second wiring connection part, wherein a first substrate connection part and a second substrate connection part respectively electrically connected to the first wiring connection part and the second wiring connection part are arranged on a rear surface of the interposer substrate; and
   a plurality of semiconductor chips mounted apart from each other in a two-dimensional (2D) manner on the interposer substrate, wherein each of the semiconductor chips is electrically connected to the interposer substrate via a chip connection pillar,
   wherein a lower surface of the first wiring connection part is lower than an upper surface of the package substrate, and
   wherein the first substrate connection part includes a first substrate solder layer contacting the upper surface of the package substrate and an upper surface of the first wiring connection part.

2. The semiconductor package of claim 1, wherein the first wiring pad is formed within the package substrate, and the first wiring connection part is formed within a first recess hole in a surface of the package substrate.

3. The semiconductor package of claim 1, wherein the second wiring pad is formed within the package substrate, and the second wiring connection part is formed within a second recess hole in a surface of the package substrate and protrudes from the surface of the package substrate.

4. The semiconductor package of claim 1, wherein the conductor constituting the second wiring connection part is one of a conductive core ball, a wiring pillar, and a combination of the conductive core ball and the wiring pillar.

5. The semiconductor package of claim 1, wherein the second wiring connection part includes a conductive core ball constituting the conductor, and a cover solder layer surrounding the conductive core ball.

6. The semiconductor package of claim 1,
   wherein the interposer substrate has cry face warpage with a center area convex above a perimeter area,
   wherein the first wiring connection part is arranged in a center area of the package substrate, and
   wherein the second wiring connection part is arranged in a perimeter area of the package substrate.

7. The semiconductor package of claim 1,
   wherein the first substrate connection part further includes a first substrate pillar formed on the rear surface of the interposer substrate, and the first substrate solder layer is formed on the first substrate pillar, and
   wherein the second substrate connection part includes a second substrate pillar formed on the rear surface of the interposer substrate, and a second substrate solder layer formed on the second substrate pillar.

8. The semiconductor package of claim 7, wherein the first substrate solder layer is formed around a portion of the first substrate pillar, and the second substrate solder layer is formed around a portion of the second substrate pillar.

9. A semiconductor package comprising:
   a package substrate having an interposer mounted area;
   an interposer substrate mounted on the interposer mounted area on the package substrate and including a first chip mounted area and a second chip mounted area spaced apart from each other in a two-dimensional (2D) manner;
   a first semiconductor chip mounted on the first chip mounted area on the interposer substrate and electrically connected to the interposer substrate via a first chip connection pillar;
   a second semiconductor chip mounted on the second chip mounted area on the interposer substrate and electrically connected to the interposer substrate via a second chip connection pillar;
   a first wiring pad formed in a first area of the package substrate corresponding to the first chip mounted area;
   a first wiring connection part formed on the first wiring pad and including a wiring solder layer;
   a second wiring pad formed in a second area of the package substrate corresponding to the second chip mounted area;
   a second wiring connection part formed on the second wiring pad and including a conductor;
   a first substrate connection part formed on a rear surface of the interposer substrate in the first chip mounted area and electrically connected to the first wiring connection part; and
   a second substrate connection part formed on the rear surface of the interposer substrate in the second chip mounted area and electrically connected to the second wiring connection part,
   wherein a lower surface of the first wiring connection part is lower than an upper surface of the package substrate, and
   wherein the first substrate connection part includes a first substrate solder layer contacting the upper surface of the package substrate and an upper surface of the first wiring connection part.

10. The semiconductor package of claim 9, wherein the first area of the package substrate corresponding to the first chip mounted area is a center area of the package substrate, and the second area of the package substrate corresponding to the second chip mounted area is a perimeter area of the package substrate.

11. The semiconductor package of claim 10,
    wherein the interposer substrate has cry face warpage with a center area convex above a perimeter area,
    wherein the first wiring connection part is arranged in the center area of the package substrate, and wherein the second wiring connection part is arranged in the perimeter area of the package substrate.

12. The semiconductor package of claim 10, wherein the first semiconductor chip is a non-memory chip and the second semiconductor chip is a memory chip.

13. The semiconductor package of claim 9, wherein the conductor constituting the second wiring connection part is one of a conductive core ball, a wiring pillar, and a combination of the conductive core ball and the wiring pillar.

14. The semiconductor package of claim 9,
wherein the first substrate connection part further includes a first substrate pillar formed on the rear surface of the interposer substrate, and the first substrate solder layer is formed on the first substrate pillar, and
wherein the wiring solder layer on the package substrate that constitutes the first wiring connection part is soldered with the first substrate solder layer on the interposer substrate.

15. The semiconductor package of claim 9,
wherein the second wiring connection part includes a conductive core ball constituting the conductor, and a cover solder layer surrounding the conductive core ball,
wherein the second substrate connection part includes a second substrate pillar formed on the rear surface of the interposer substrate, and a second substrate solder layer formed on the second substrate pillar, and
wherein the cover solder layer on the package substrate that constitutes the second wiring connection part is soldered with the second substrate solder layer on the interposer substrate.

16. The semiconductor package of claim 9,
wherein the second wiring connection part includes a wiring pillar constituting the conductor,
wherein the second substrate connection part includes a second substrate pillar formed on the rear surface of the interposer substrate, and a second substrate solder layer formed on the second substrate pillar, and
wherein the wiring pillar on the package substrate that constitutes the second wiring connection part is soldered with the second substrate solder layer on the interposer substrate.

17. A semiconductor package comprising:
a package substrate having an interposer mounted area;
an interposer substrate mounted on the interposer mounted area on the package substrate and including a first chip mounted area, a second chip mounted area, and a third chip mounted area spaced apart from each other in a two-dimensional (2D) manner;
a first semiconductor chip mounted on the first chip mounted area on the interposer substrate and electrically connected to the interposer substrate via a first chip connection pillar;
a second semiconductor chip mounted on the second chip mounted area on the interposer substrate and electrically connected to the interposer substrate via a second chip connection pillar;
a third semiconductor chip mounted on the third chip mounted area on the interposer substrate and electrically connected to the interposer substrate via a third chip connection pillar;
a first wiring pad formed in a first area of the package substrate corresponding to the first chip mounted area;
a first wiring connection part formed on the first wiring pad and including a wiring solder layer;
a second wiring pad and a third wiring pad formed in a second area and a third area of the package substrate respectively corresponding to the second chip mounted area and the third chip mounted area;
a second wiring connection part and a third wiring connection part formed on the second wiring pad and the third wiring pad, respectively and each including a conductor;
a first substrate connection part formed on one surface of the interposer substrate in the first chip mounted area and electrically connected to the first wiring connection part; and
a second substrate connection part and a third substrate connection part formed on rear surfaces of the interposer substrate in the second and second chip mounted areas, respectively, and electrically connected to the second wiring connection part and the third wiring connection part,
wherein a lower surface of the first wiring connection part is lower than an upper surface of the package substrate, and
wherein the first substrate connection part includes a first substrate solder layer contacting the upper surface of the package substrate and an upper surface of the first wiring connection part.

18. The semiconductor package of claim 17, wherein the conductor constituting each of the second and third wiring connection parts is one of a conductive core ball, a wiring pillar, and a combination of the conductive core ball and the wiring pillar.

19. The semiconductor package of claim 17,
wherein the first semiconductor chip is a non-memory chip and the second and third semiconductor chips are memory chips,
wherein the first area of the package substrate corresponding to the first chip mounted area is a center area of the package substrate, and the second area and the third area of the package substrate respectively corresponding to the second chip mounted area and the third chip mounted area are perimeter areas of the package substrate.

20. The semiconductor package of claim 19,
wherein the interposer substrate has cry face warpage with a center area convex above a perimeter area,
wherein the first wiring connection part is arranged in the center area of the package substrate, and
wherein the second wiring connection part and the third wiring connection part are arranged in the perimeter area of the package substrate.

* * * * *